US012376414B2

(12) United States Patent
Yu

(10) Patent No.: US 12,376,414 B2
(45) Date of Patent: Jul. 29, 2025

(54) SOURCE WAFER AND METHOD OF PREPARATION THEREOF

(71) Applicant: ROCKLEY PHOTONICS LIMITED, Altrincham (GB)

(72) Inventor: Guomin Yu, Glendora, CA (US)

(73) Assignee: Rockley Photonics Limited, Altrincham (GB)

( * ) Notice: Subject to any disclaimer, the term of this patent is extended or adjusted under 35 U.S.C. 154(b) by 301 days.

(21) Appl. No.: 17/791,524

(22) PCT Filed: Jan. 8, 2021

(86) PCT No.: PCT/EP2021/050304
§ 371 (c)(1),
(2) Date: Jul. 7, 2022

(87) PCT Pub. No.: WO2021/140219
PCT Pub. Date: Jul. 15, 2021

(65) Prior Publication Data
US 2023/0036209 A1 Feb. 2, 2023

Related U.S. Application Data

(60) Provisional application No. 62/959,669, filed on Jan. 10, 2020.

(51) Int. Cl.
*H10F 71/00* (2025.01)
*H01S 5/02* (2006.01)
*H10F 77/30* (2025.01)

(52) U.S. Cl.
CPC ......... *H10F 71/139* (2025.01); *H01S 5/0203* (2013.01); *H10F 77/30* (2025.01)

(58) Field of Classification Search
CPC ....... H01L 33/0062–0075; H01L 2221/68318; H01L 2221/68381
See application file for complete search history.

(56) References Cited

U.S. PATENT DOCUMENTS

| 8,889,485 B2* | 11/2014 | Bower | H01L 21/6838 |
| | | | 257/737 |
| 9,217,541 B2* | 12/2015 | Bathurst | H01L 21/7806 |
| 9,368,683 B1* | 6/2016 | Meitl | H01L 33/36 |
| 9,370,864 B2* | 6/2016 | Bibl | B41J 2/385 |

(Continued)

FOREIGN PATENT DOCUMENTS

| JP | 2010-504649 A | 2/2010 |
| JP | 2018-506850 A | 3/2018 |

OTHER PUBLICATIONS

International Search Report and Written Opinion of the International Searching Authority, mailed Apr. 26, 2021, corresponding to PCT/EP2021/050304, 15 pages.

(Continued)

*Primary Examiner* — Evren Seven
(74) *Attorney, Agent, or Firm* — Womble Bond Dickinson (US) LLP

(57) ABSTRACT

A source wafer for use in a micro-transfer printing process. The source wafer comprises: a substrate; a device coupon (110), including an optoelectronic device; and a breakable tether securing the device coupon to the substrate. The breakable tether includes one or more breaking regions which connect the breakable tether to the substrate.

22 Claims, 28 Drawing Sheets

(56) References Cited

U.S. PATENT DOCUMENTS

| | | | | |
|---|---|---|---|---|
| 9,640,715 | B2* | 5/2017 | Bower | H01L 33/32 |
| 9,761,754 | B2* | 9/2017 | Bower | H01L 25/50 |
| 10,832,934 | B2* | 11/2020 | Trindade | B41F 16/0046 |
| 10,832,935 | B2* | 11/2020 | Bower | H01L 33/0095 |
| 10,944,034 | B2* | 3/2021 | Kuo | H01L 33/52 |
| 11,088,007 | B1* | 8/2021 | Fecioru | H01L 21/6835 |
| 11,398,399 | B2* | 7/2022 | Trindade | B81C 1/00269 |
| 11,488,943 | B2* | 11/2022 | Bower | H01L 27/15 |
| 11,652,082 | B2* | 5/2023 | Cok | H01L 21/67092 |
| | | | | 438/107 |
| 11,791,446 | B2* | 10/2023 | Sheng | H01L 25/0753 |
| | | | | 257/79 |
| 12,006,205 | B2* | 6/2024 | Trindade | B81C 1/00476 |
| 12,094,851 | B2* | 9/2024 | Cok | B41F 16/0046 |
| 2006/0063309 | A1* | 3/2006 | Sugiyama | H01L 27/1266 |
| | | | | 438/30 |
| 2012/0313241 | A1* | 12/2012 | Bower | H01L 24/13 |
| | | | | 257/737 |
| 2015/0371874 | A1 | 12/2015 | Bower et al. | |
| 2016/0086855 | A1 | 3/2016 | Bower et al. | |
| 2016/0336488 | A1* | 11/2016 | Bower | H01L 33/44 |
| 2017/0256521 | A1* | 9/2017 | Cok | H01L 25/162 |
| 2018/0042110 | A1* | 2/2018 | Cok | H01L 25/105 |
| 2018/0174910 | A1* | 6/2018 | Bower | H01L 25/50 |
| 2018/0286734 | A1* | 10/2018 | Meitl | H01L 24/06 |
| 2018/0301872 | A1 | 10/2018 | Burroughs et al. | |
| 2019/0051552 | A1* | 2/2019 | Bower | B41F 16/00 |
| 2019/0189851 | A1* | 6/2019 | He | H01L 33/007 |
| 2019/0300289 | A1 | 10/2019 | Cok | |
| 2019/0385885 | A1* | 12/2019 | Trindade | H01L 21/561 |
| 2020/0243714 | A1* | 7/2020 | Chang | H01L 33/0075 |
| 2021/0043816 | A1* | 2/2021 | Bower | H01L 24/13 |
| 2021/0359162 | A1* | 11/2021 | Niwa | H01L 33/0075 |

OTHER PUBLICATIONS

Lerner, R. et al., "Heterogeneous Integration of Microscale Gallium Nitride Transistors by Micro-Transfer-Printing", 2016 IEEE 66th Electronic Components and Technology Conference (ECTC), 2016, pp. 1186-1189, IEEE.

U.K. Intellectual Property Office Examination Report, dated Feb. 3, 2022, for Patent Application No. GB2100271.2, 4 pages.

U.K. Intellectual Property Office Examination Report, dated Jun. 10, 2022, for Patent Application No. GB2100271.2, 4 pages.

U.K. Intellectual Property Office Search and Examination Report, dated Jun. 11, 2021, for Patent Application No. GB2100271.2, 9 pages.

Japanese Notification of Office Action, for Patent Application No. 2022-542382, dated Jul. 30, 2024, 6 pages.

Machine English translation for Japanese Notification of Office Action, for Patent Application No. 2022-542382, dated Jul. 30, 2024, 5 pages.

Japanese Notification of Office Action, and Partial English translation, for Patent Application No. JP 2022-542382, mailed Nov. 12, 2024, 7 pages.

Communication pursuant to Article 94(3) EPC for Patent Application No. 21 702 162.5, mailed Apr. 1, 2025, 7 pages.

* cited by examiner

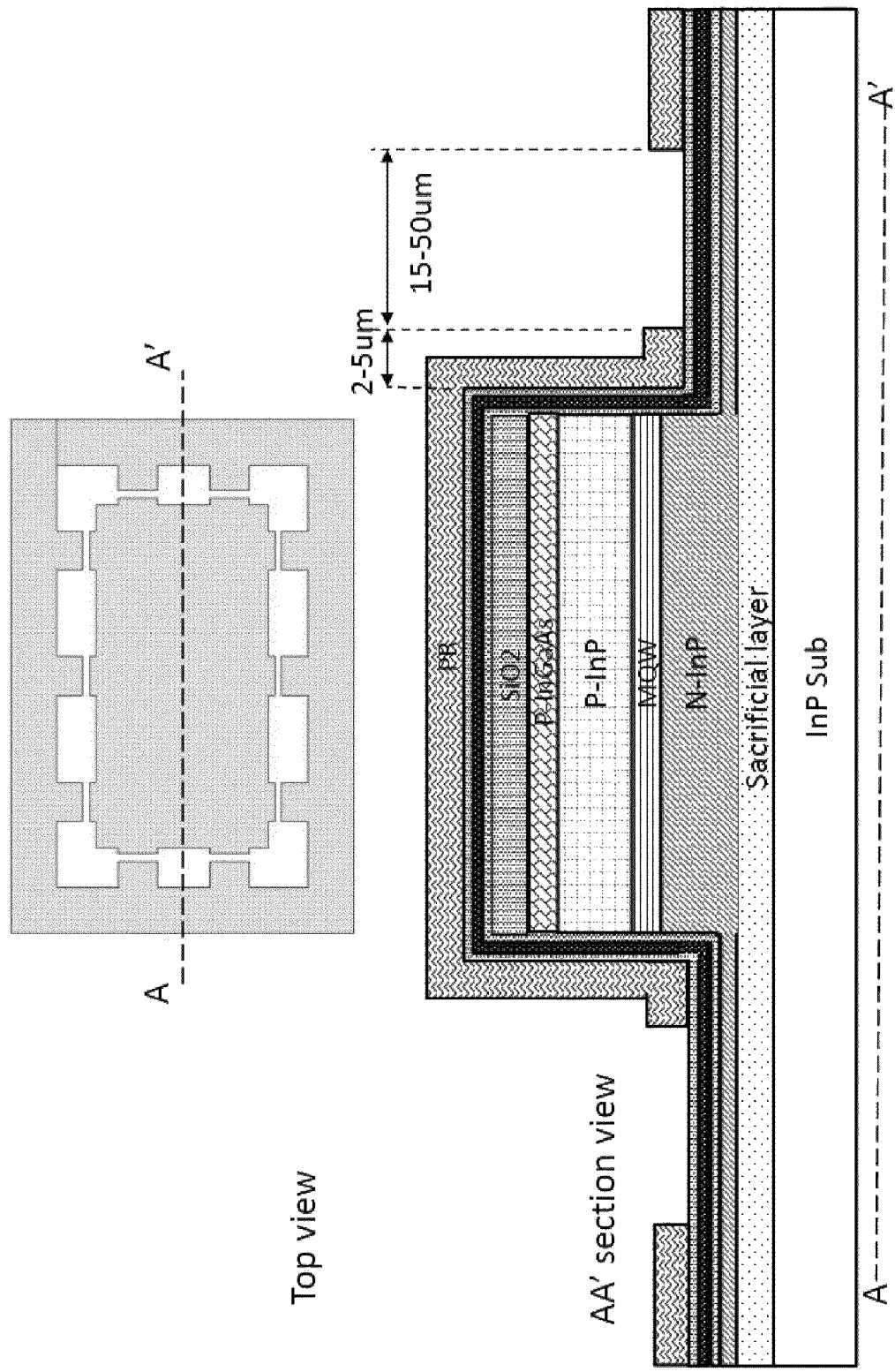

2 # SOURCE WAFER AND METHOD OF PREPARATION THEREOF

CROSS-REFERENCE TO RELATED APPLICATIONS

The present application is a U.S. national stage entry, under 35 U.S.C. § 371, of International Application Number PCT/EP2021/050304, filed on Jan. 8, 2021, which claims priority to, and the benefit of, US 62/959,669 filed 10 Jan. 2020 (10/01/2020), the contents of all of the applications identified in this paragraph are incorporated herein by reference in their entirety.

FIELD OF THE INVENTION

The present invention relates to a source wafer, a method of preparation thereof, a method of fabricating an optoelectronic component, and an optoelectronic component.

BACKGROUND

Hybrid integration of III-V semiconductor based electro-optical devices (e.g. lasers, modulators, and amplifiers), with silicon-on-insulator (SOI) platforms confers the advantage of combining the best parts of both materials systems.

However, conventional chip bonding processes typically use flip-chip bonding, in which the III-V semiconductor based device is inverter and bonded into a cavity on the SOI platform. The manufacturing process can be costly and have a low yield, because of the metal bumping requirements for the die bonding and difficulties in accurately controlling the alignment of respective components.

Micro-transfer printing (MTP) is therefore being investigated as an alternative way to integrate III-V semiconductor based devices within an SOI wafer. In these methods, the III-V semiconductor based device is fabricated on a device or source wafer. It can then be picked up using a stamp (typically formed of elastomer) and printed into a cavity on the SOI wafer in the same orientation in which it was manufactured and without the need for metal bumping. The alignment between the III-V semiconductor based device and the waveguides in the SOI platform are thereby predetermined in the vertical direction (z direction). The requirements for alignment are therefore reduced from three dimensions to two, which can be more easily facilitated.

However, there remains a number of issues for MTP. For example, when the coupon is released via a release etch capillary force can cause the coupon to collapse. This is typically due to a tether of insufficient strength, and/or insufficient adhesion between the tether and the III-V substrate. However if the tether is made too strong then the coupon may not be picked up by the stamp, and so may result in a lower yield. Moreover, sidewall tether protruding out of the coupon bottom surface can also cause low yield. For example, the tether may bend underneath the coupon surface which could prevent the coupon from being printed onto the substrate. Further, the tether may break in an inappropriate place, and make too much debris (due for example to insufficient adhesion between the tether and the III-V substrate). The tether debris can fall underneath the coupon bottom surface, and prevent printing or contaminate the target surface during the printing process.

There is a desire to improve the MTP process, specifically to improve the volume and yield so as to render the process commercially viable.

SUMMARY

Accordingly, in a first aspect, embodiments of the present invention provide a source wafer for use in a micro-transfer printing process, the source wafer comprising:
a substrate;
a device coupon, including an optoelectronic device; and
a breakable tether securing the device coupon to the substrate, the breakable tether including one or more breaking regions which connect the breakable tether to the substrate.

By providing such breaking points, a higher pickup yield and higher print yield can be achieved during subsequent MTP processing.

Optional features of embodiments of the invention will now be set out. These are applicable singly or in any combination with any aspect of the invention.

By breaking region, is may be meant one or more regions of the breakable tether which have been deliberately engineered to be weak and so preferentially break when the device coupon is lifted from the substrate.

The or each breaking region may include a neck of breakable tether material which extends across a cavity between the device coupon and a tether street which at least partially surrounds the device coupon. By bonding the or each breaking region to a tether street, the adhesion between the device coupon and substrate can be made sufficiently strong. The tether street may be a layer of tether material which extends around a periphery of the device coupon, above the substrate. The tether street may be separated from the substrate by one or more layers. The one or more layers may include an inner silicon dioxide, an intermediate silicon nitride layer, and an outer silicon dioxide layer. The outer silicon oxide layer may be adjacent to the tether street, and the inner silicon dioxide layer may be closest to the substrate. The inner silicon dioxide layer may be separated from the substrate by a layer formed of a same material as sacrificial layer.

The or each breaking region may be thinner than adjacent portions of the breakable tether. By thinner, it may be meant that a dimension of the or each breaking region as measured in a direction out of the plane of the substrate is smaller than equivalent dimensions adjacent portions of the breakable tether. The or each breaking region may be narrower than adjacent portions of the breakable tether. By narrower, it may be meant that a dimension of the or each breaking region as measured across the plane of the substrate is smaller than equivalent dimensions of adjacent portions of the breakable tether.

The breakable tether may include a plurality of breaking regions which are disposed around a periphery of the device coupon. The breaking regions may be disposed at equidistant points around a periphery of the device coupon. The periphery may be a lateral one, i.e. one across the plane of the substrate.

The device coupon may be secured to the substrate only by the breaking regions of the breakable tether.

The source wafer may further comprise a sacrificial layer between the device coupon and the substrate.

The optoelectronic device may be formed of one or more III-V semiconductor materials. The optoelectronic device may comprise a plurality of layers.

The device coupon may include one or more protective outer layers. The protective outer layers include: an outer silicon dioxide layer, an intermediate silicon nitride layer, and an inner silicon dioxide layer.

An outermost layer of the device coupon and/or an uppermost layer of the on the substrate may be formed of silicon dioxide and the tether may be formed of photoresist. Strong adhesion can be achieved between silicon dioxide and photoresist which can prevent debris forming after pick-up.

The breaking regions may be weaker than adjacent regions of the breakable tether. By weaker, it may be meant that the breaking regions have a lower shear strength than adjacent regions of the breakable tether.

The optoelectronic device may be an optoelectronic device selected from the group consisting of lasers, photodetectors, and electro-absorption modulators. It may also be a mirror, pump, amplifier, grating, or passive waveguide.

The device coupon may be separated from the substrate by a cavity which extends entirely around the device coupon, wherein the cavity is bridged by the one or more breaking regions thereby securing the device coupon to the substrate.

The breakable tether may be formed of a photoresist. The breakable tether may be formed of a dielectric.

In a second aspect, embodiments of the invention provide a method of preparing a source wafer for a micro-transfer printing process, the source wafer comprising:
  a substrate;
  a device coupon, including an optoelectronic device; and
  a precursor tether, disposed over at least a portion of the device coupon and substrate; the method comprising:
  etching the precursor tether, to define a breakable tether including one or more breaking regions which connect the breakable tether to the substrate.

The method may further comprise etching the substrate and/or device coupon so that the device coupon is secured to the substrate by the breaking regions of the breakable tether. The etching may result in the device coupon being secured to the substrate solely by the breaking regions of the breakable tether. Further etching the substrate and/or device coupon may include etching away a sacrificial layer located between the device coupon and the substrate.

Etching the precursor tether may include an initial step of patterning the precursor tether to define the one or more breaking regions.

The method may further comprise step of performing a plasma ashing process, to remove a portion of the breakable tether.

The method may further comprise a step of at least partially encapsulating the device in a protective layer.

In a third aspect, embodiments of the invention provide a method of fabricating an optoelectronic component via a micro-transfer printing process using the source wafer of the first aspect, the method comprising the steps of:
  adhering the device coupon to a stamp;
  lifting the device coupon away from the substrate, thereby breaking the breakable tether at the or each breaking region; and
  printing the device coupon onto a platform wafer.

In a fourth aspect, embodiments of the invention provide an optoelectronic component fabricated using the method of the third aspect.

The invention includes the combination of the aspects and preferred features described except where such a combination is clearly impermissible or expressly avoided.

Further aspects of the present invention provide: a computer program comprising code which, when run on a computer, causes the computer to perform the method of the second or third aspects; a computer readable medium storing a computer program comprising code which, when run on a computer, causes the computer to perform the method of the second or third aspects; and a computer system programmed to perform the method of the second or third aspects.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

Figure 1:
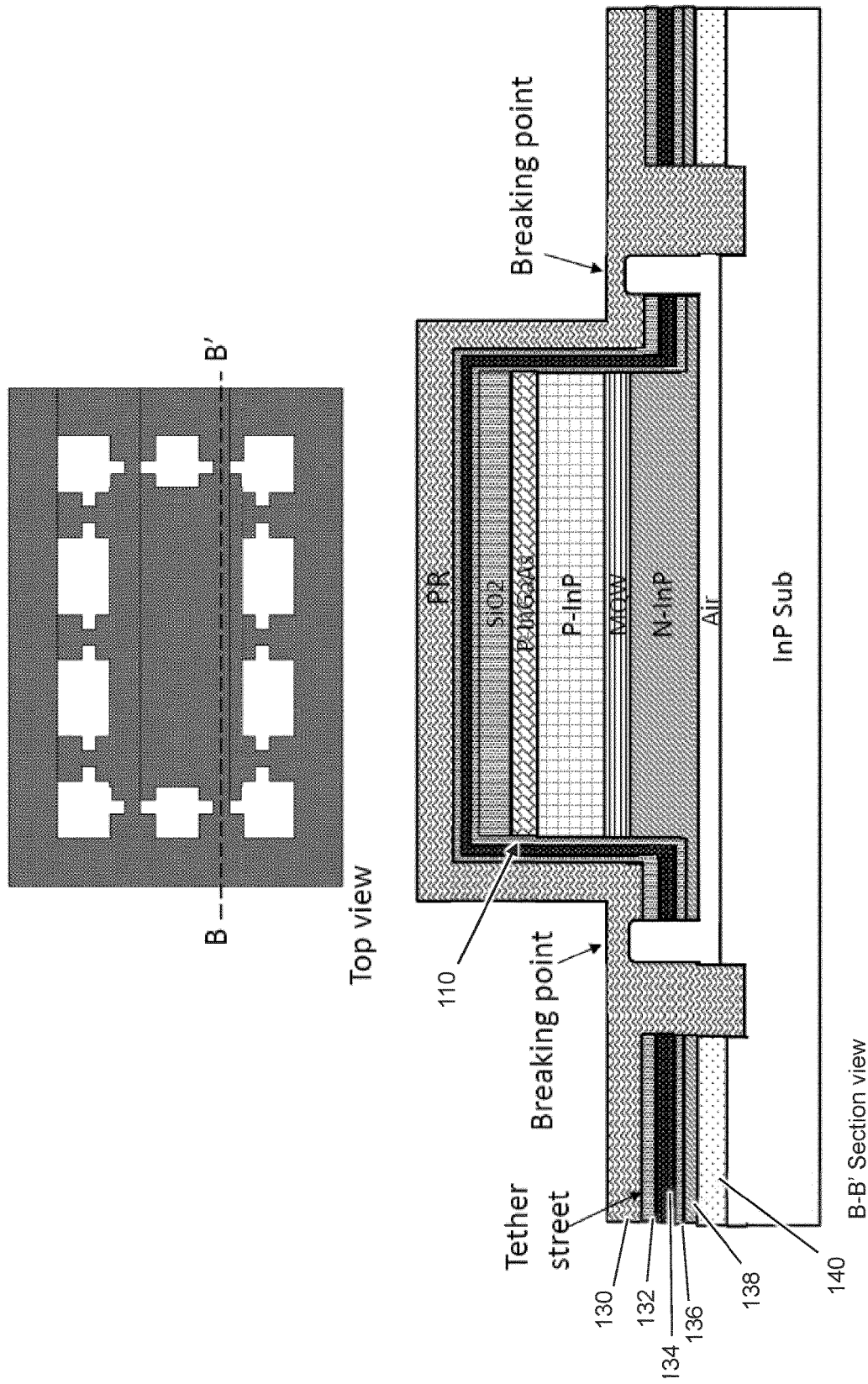
FIG. 1 shows a top-down and cross-sectional view of a source wafer according to an embodiment of the present invention.
Figure 2:
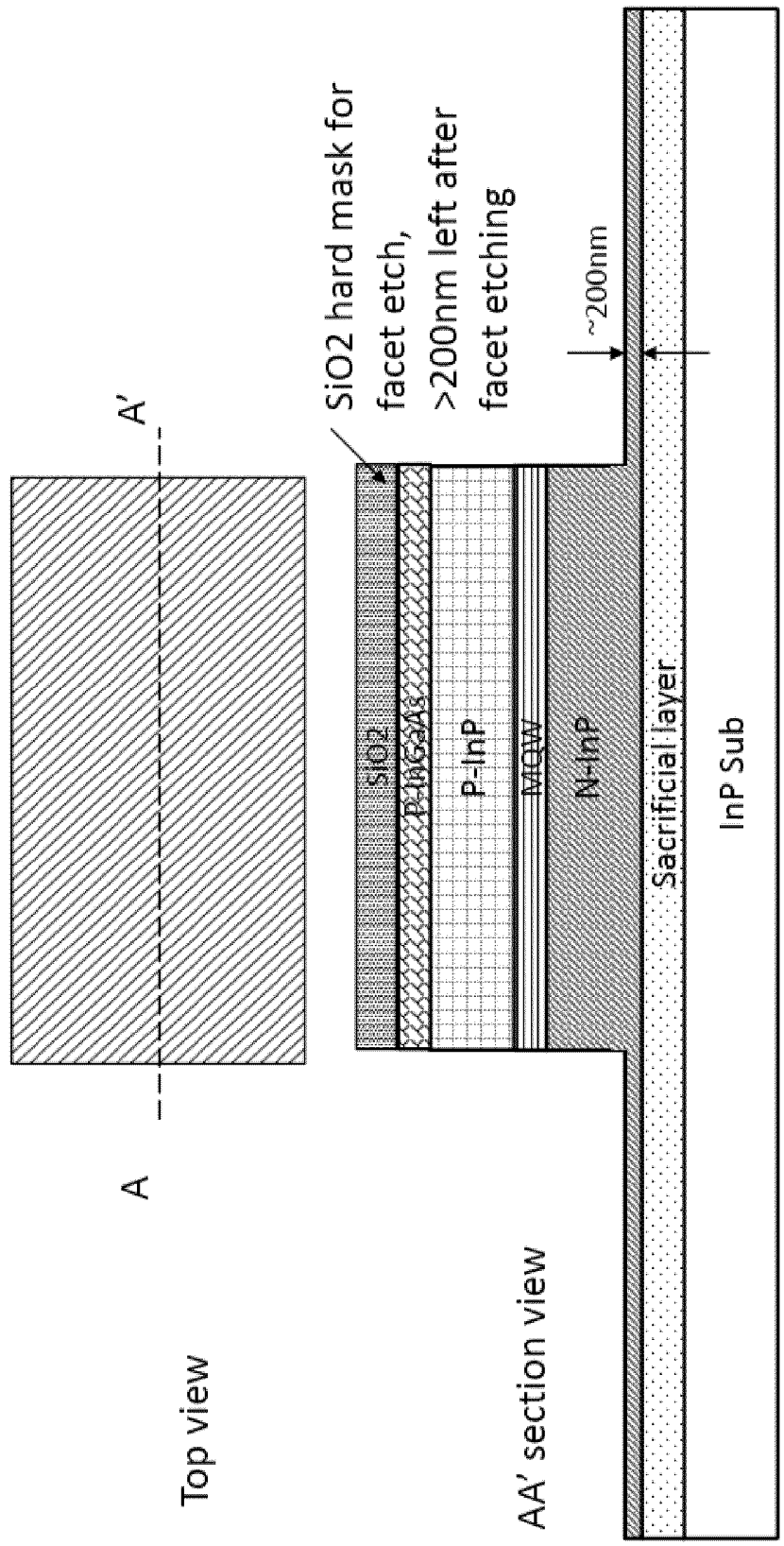
FIGS. 2-10C show top-down and cross-sectional views of various steps of a method according to an embodiment of the present invention.

FIG. 1 shows a top-down (upper) and cross-sectional (lower) view of a source wafer according to an embodiment of the present invention. The source wafer includes a substrate, in this example an indium phosphide substrate, which is attached to a device coupon 110 via a breakable tether 120. The breakable tether includes a plurality of breaking regions. These breaking regions, or breaking points, are narrow regions of tether material 130 which extend across a cavity extending around a periphery of the device coupon 110 (as shown most clearly in the top-down view). The device coupon 110 is attached to the substrate solely via these breaking regions, as an air gap exists between the device coupon and the substrate.

The breaking regions extend from the device coupon 110 to a tether street located above the substrate. The tether street extends around the periphery of the source wafer, and is provided by: a photoresist layer 130, an outer silicon dioxide layer 132, a silicon nitride layer 134, an inner silicon dioxide layer 136, an n-doped indium phosphide layer 138, and a sacrificial layer 140. The photoresist 130 extends down a sidewall of this stack, as seen most clearly in the cross-sectional figure (a cross-section along the line B-B' in the top-down view).

The device coupon in this example comprises, in order from the furthest from the substrate to the closest: protective layers, a silicon dioxide layer, a p-doped indium gallium arsenide (P—InGaAs), a p-doped indium phosphide (P—InP) layer, a multiple quantum well (MQW) layer, and an n-doped indium phosphide (N—InP) layer. The protective layers include an outer silicon dioxide layer, an intermediate silicon nitride layer, and an inner silicon dioxide layer. The intermediate silicon nitride layer may function as an antireflective coating for light entering/exiting the optoelectronic component provided within the device coupon.

FIGS. 2-10C show top-down and cross-sectional views of various steps of a method according to an embodiment of the present invention. In a first step, shown in FIG. 2, a III-V semiconductor based device is provided. The following process steps may have already been completed: waveguide fabrication; waveguide isolation; dielectric shaping (e.g. benzocyclobutene resin); provision of P and N electrodes. A 500 nm thick silicon dioxide ($SiO_2$) hard mask is then provided, patterned, and the facets etched. A 200 nm thick $SiO_2$ layer is retained after the facet etch.

Figure 3:
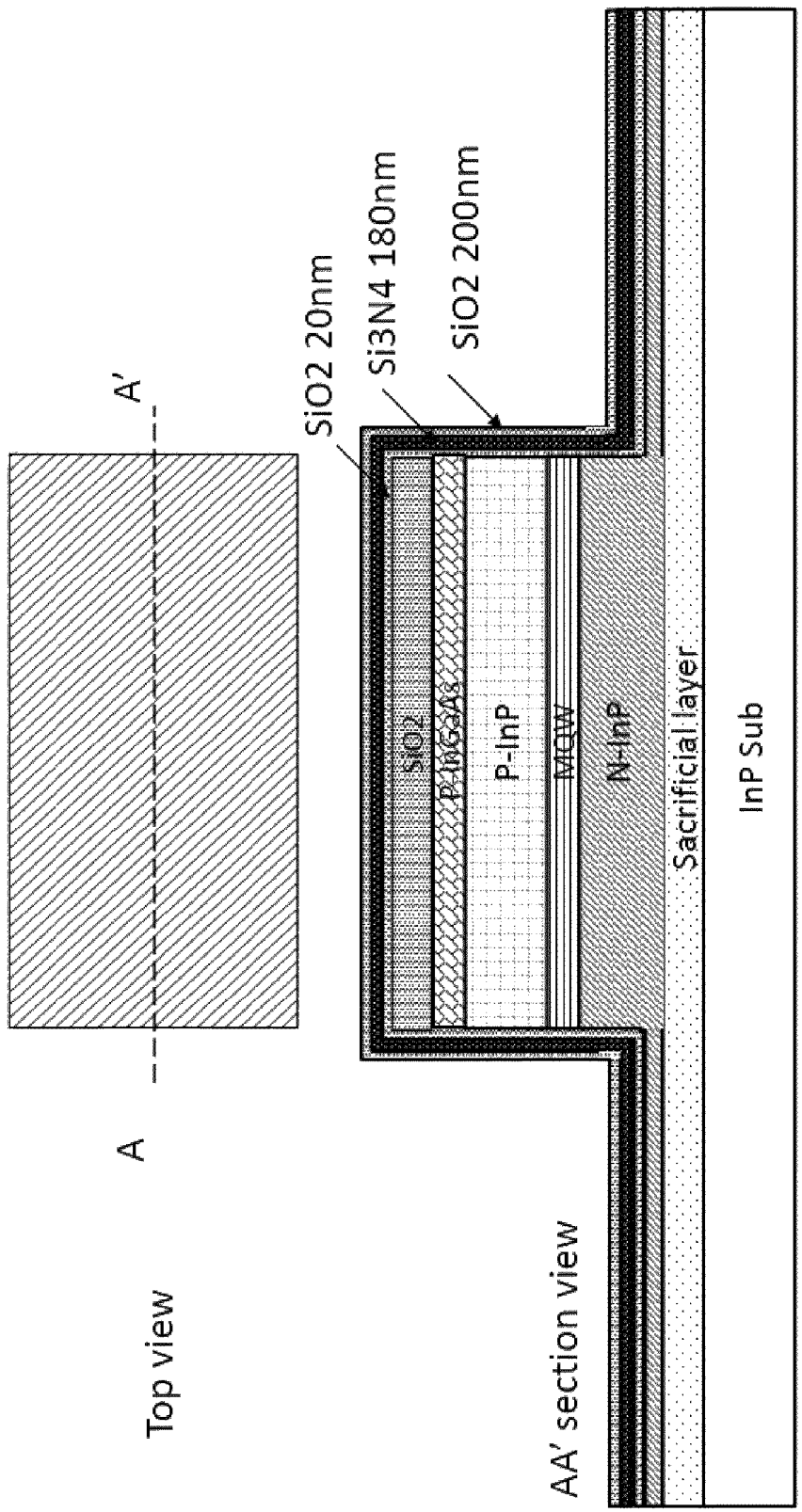
Figure 4B:
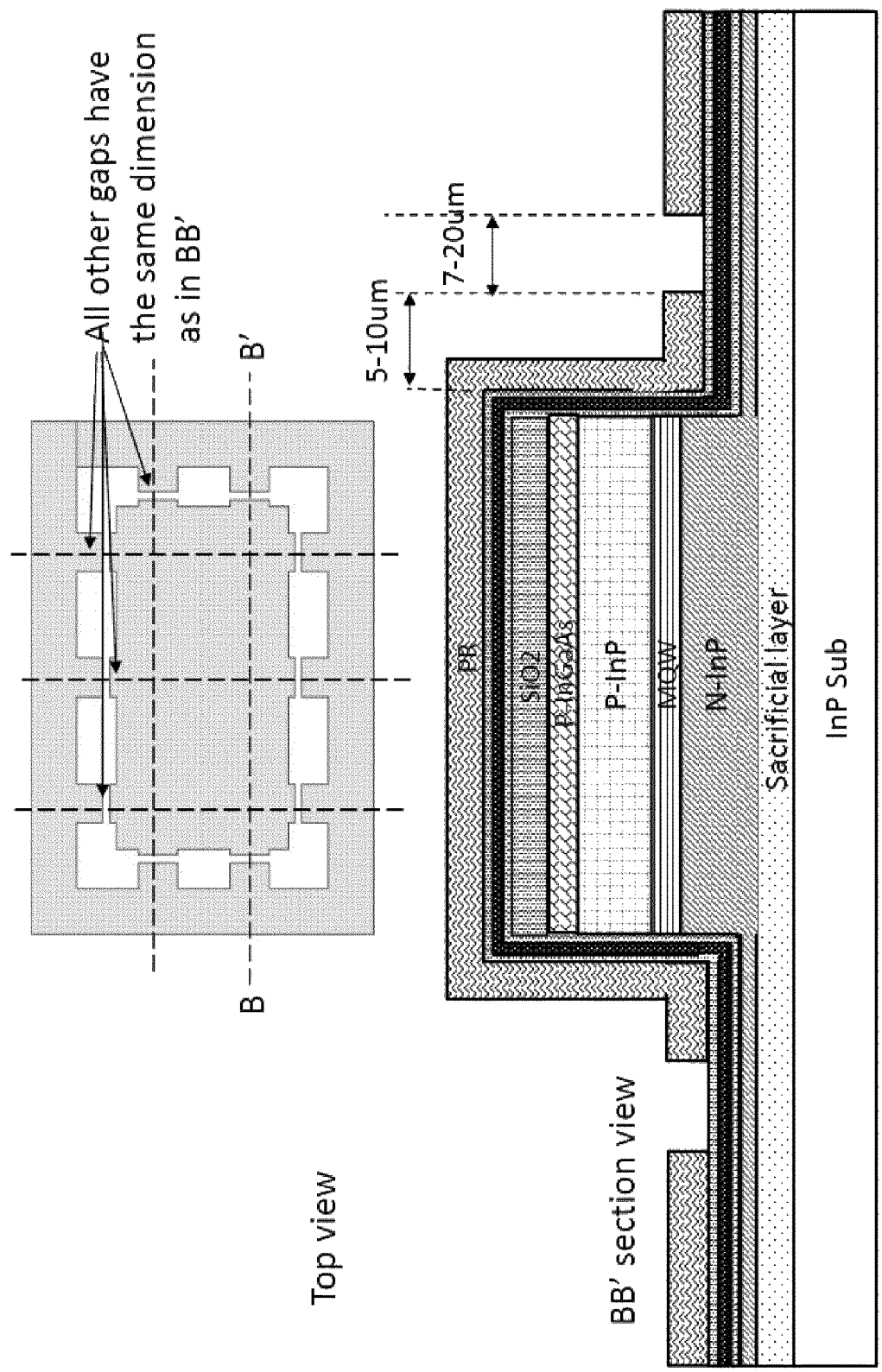
Figure 4C:
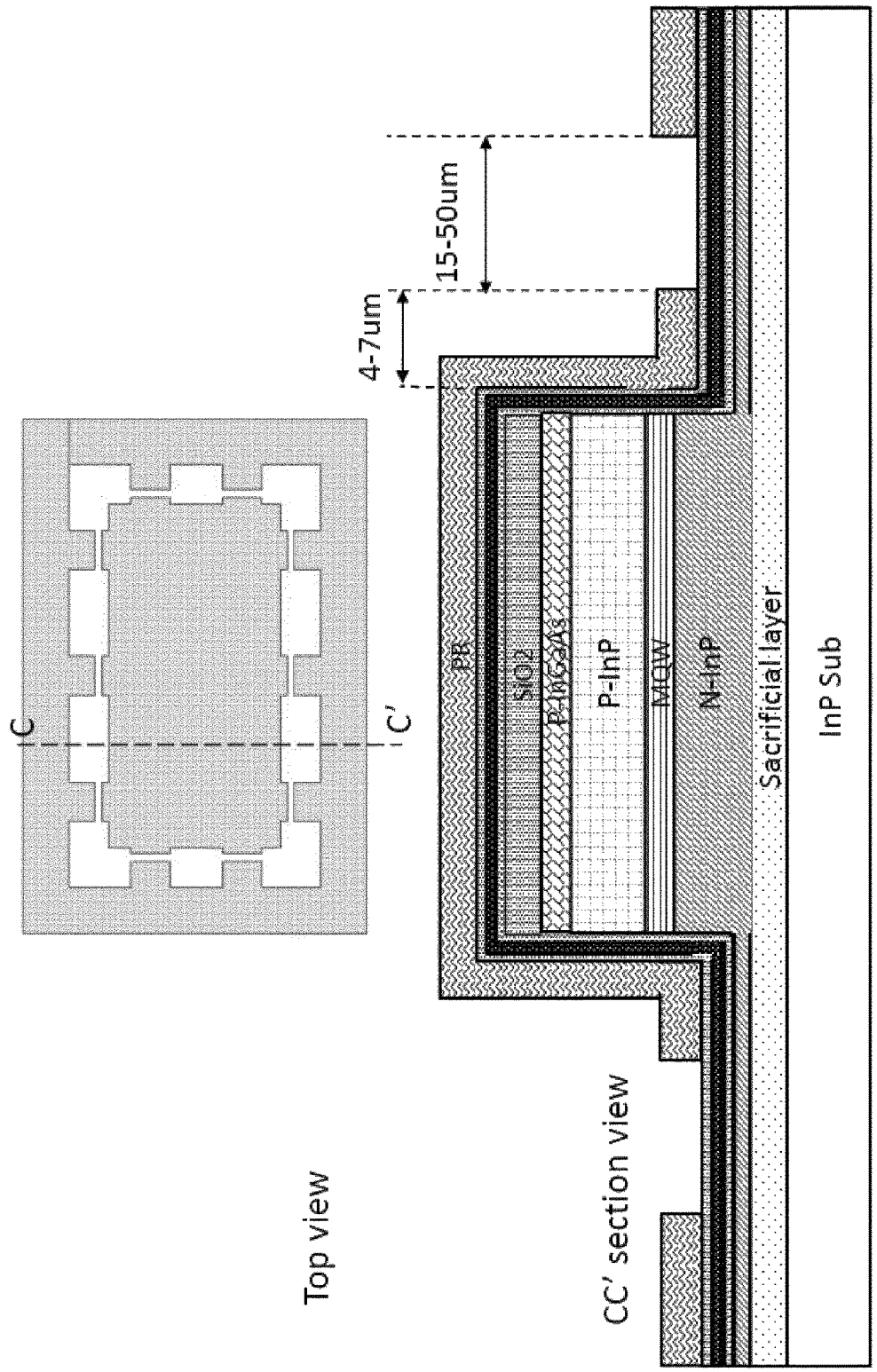

Next, as shown in FIG. 3, the protective layers are deposited which provide an antireflective coating. The protective layers comprise a 20 nm thick inner $SiO_2$ layer; a 180 nm thick $Si_3N_4$ layer; and a 200 nm thick outer $SiO_2$ layer. An optional additional 100 nm silicon nitride layer (not shown here) can be added as wet etch hard mask for the outer $SiO_2$ layer. Photoresist is then spun coated onto the source wafer, and patterned to define the device coupon. The result of this is shown in FIGS. 4A-4C, which are cross-sections along the lines A-A', B-B', and C-C' respectively. As can be seen from FIG. 4A, a gap of 15 μm to 50 μm may be formed in the photoresist thereby exposing the outer silicon dioxide layer. The distance between the outer silicon dioxide layer on the device coupon and the gap may be 2 μm to 5 μm. This distance is covered by photoresist, as shown.

Figure 5A:
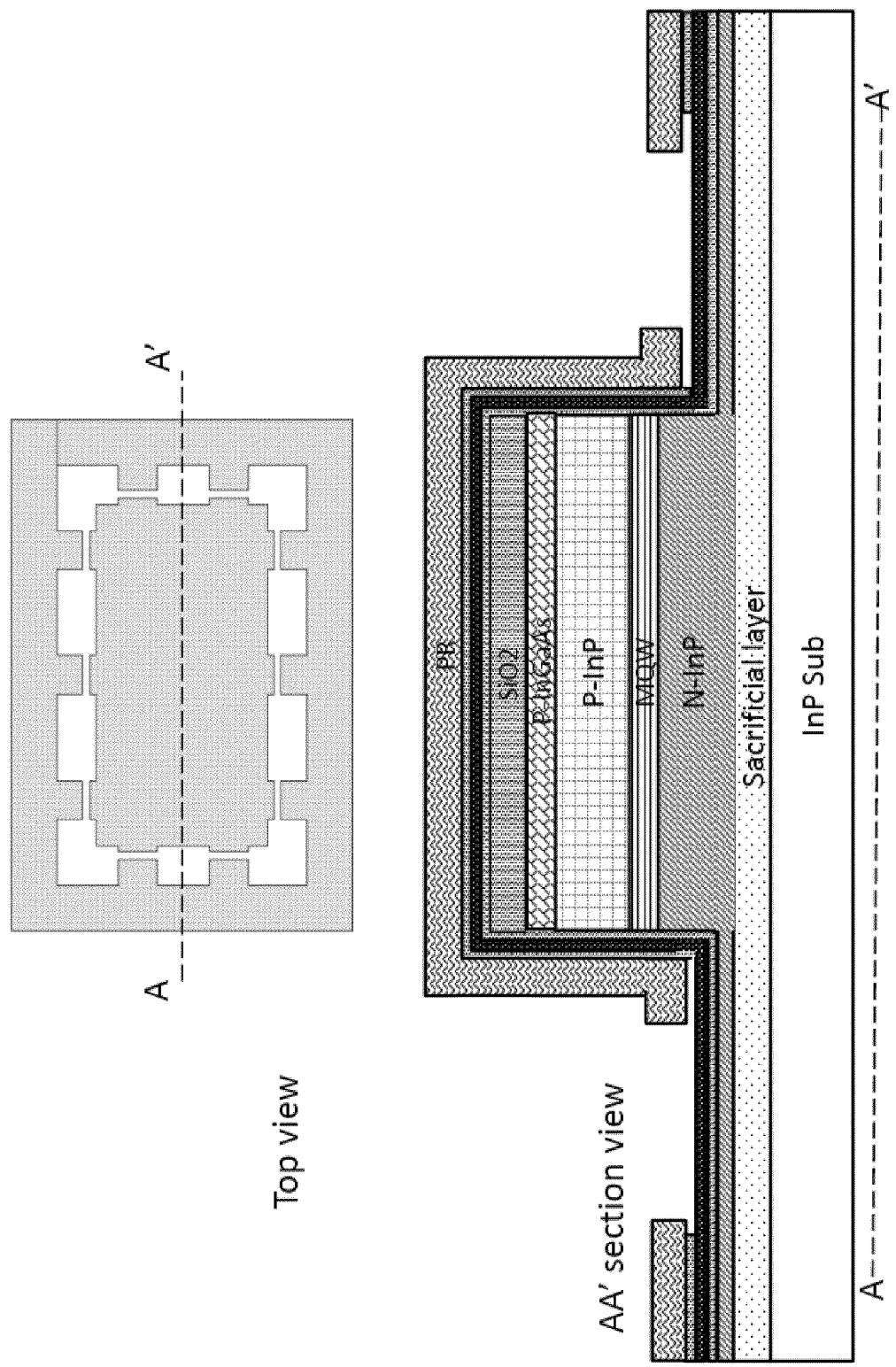
Figure 5B:
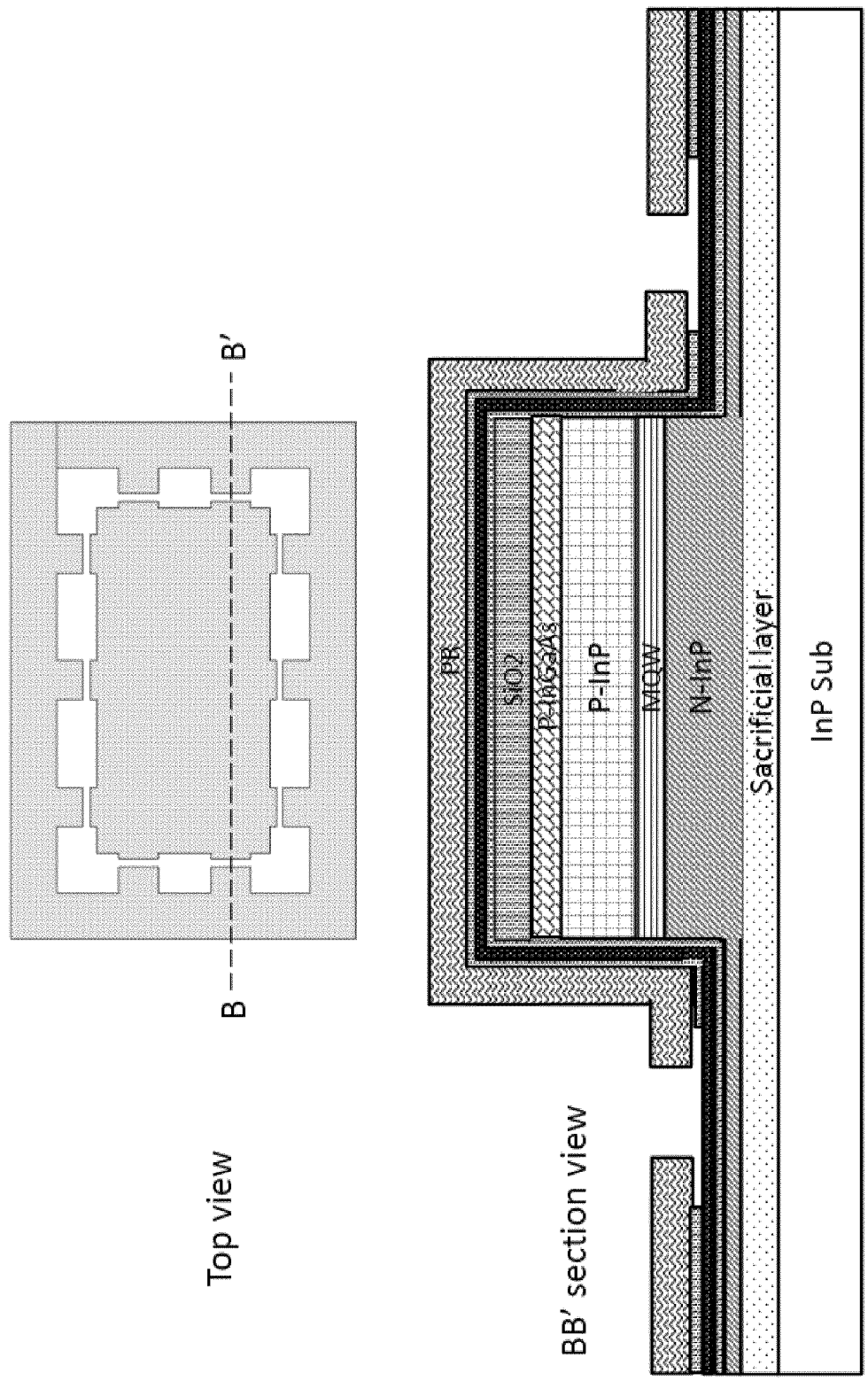
Figure 5C:
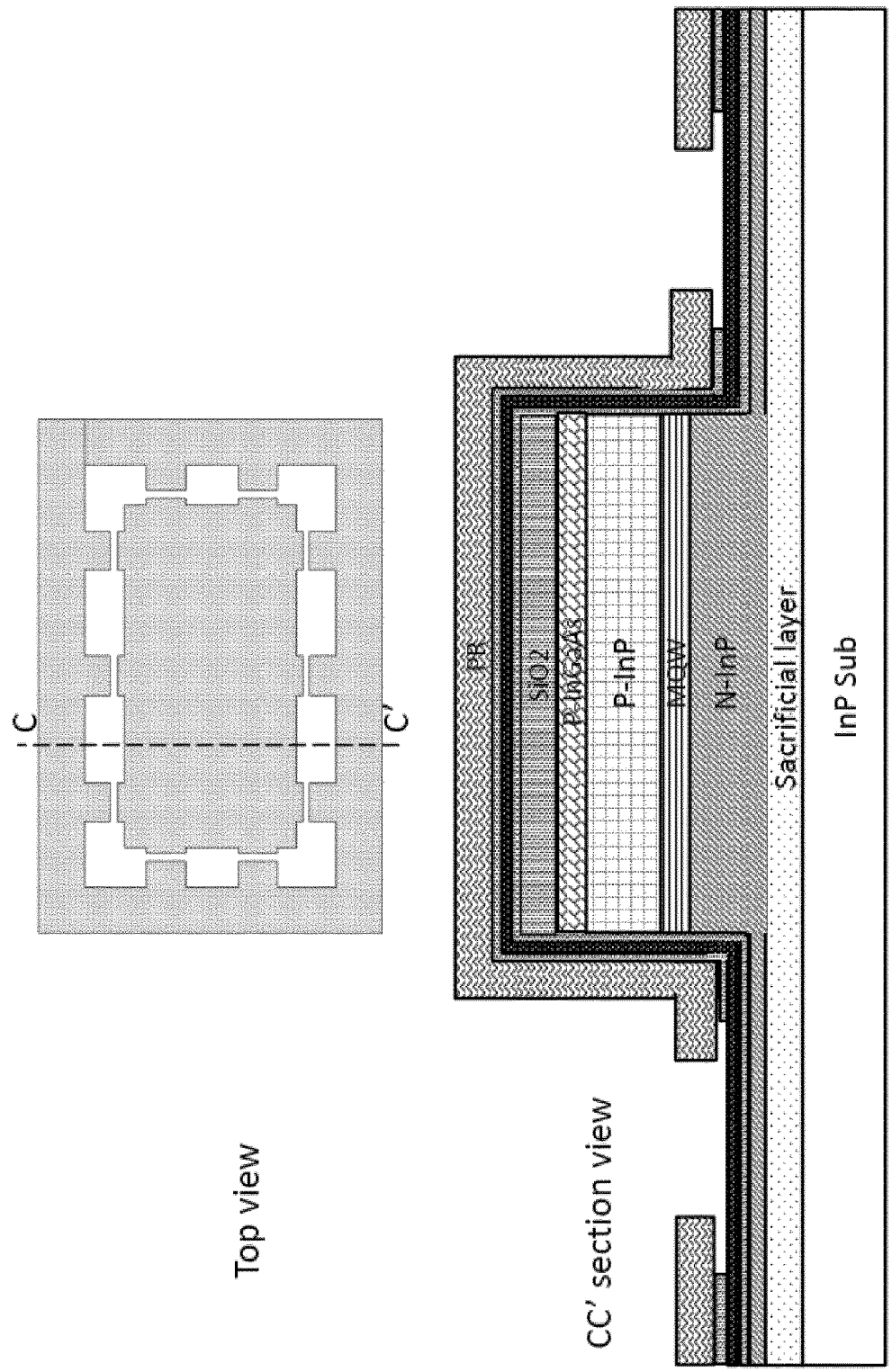
Figure 6A:
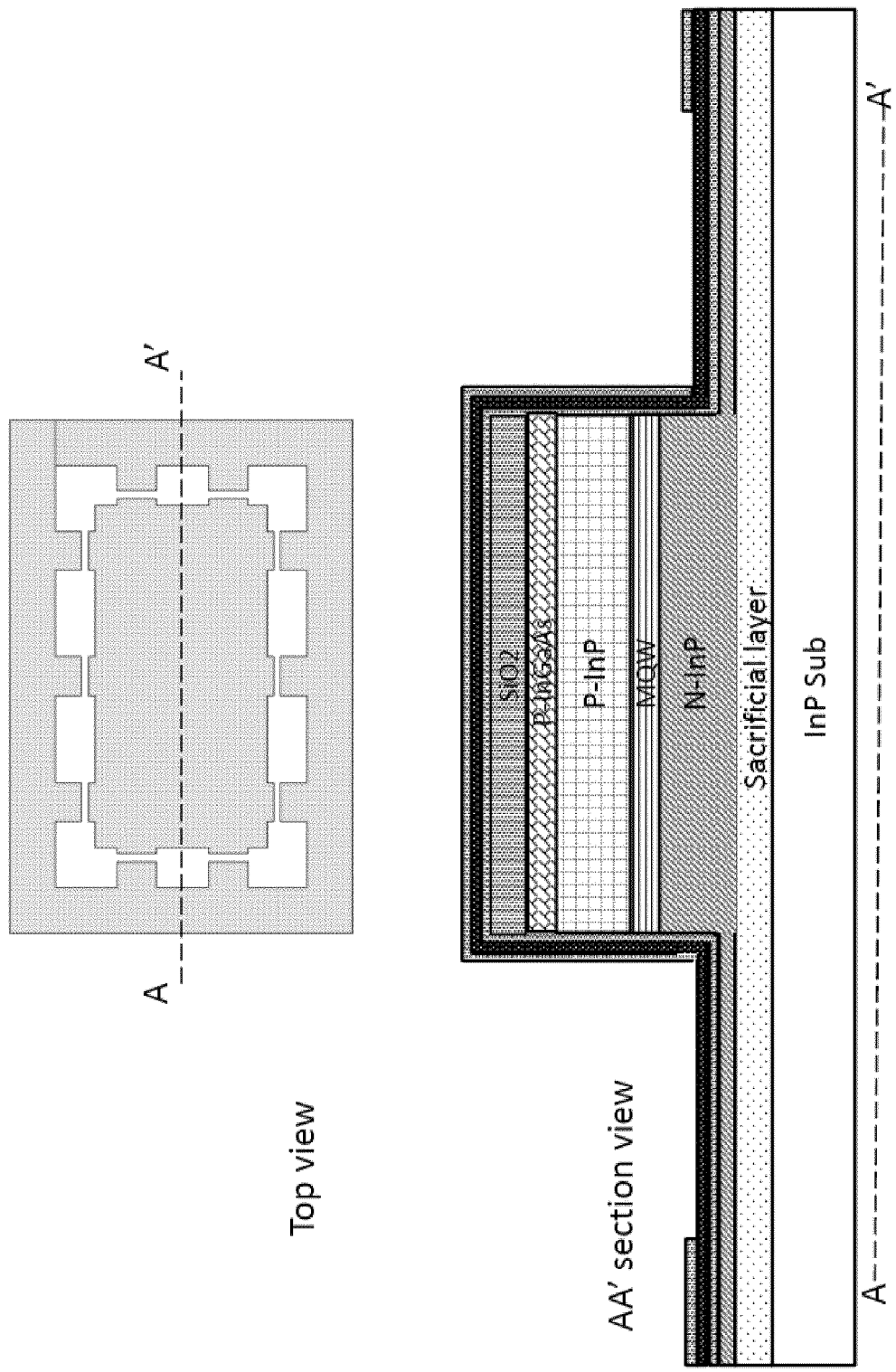
Figure 6B:
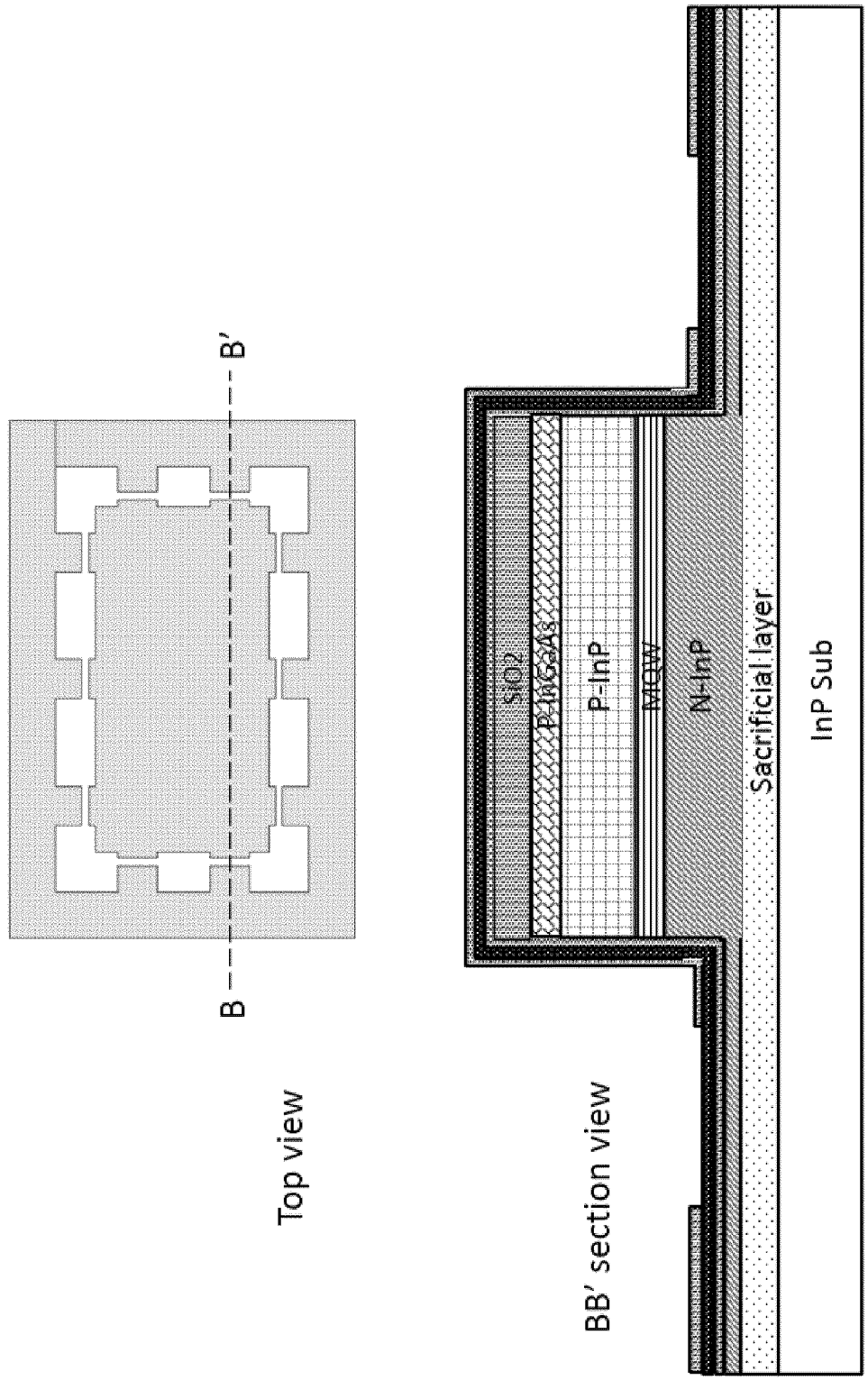
Figure 6C:
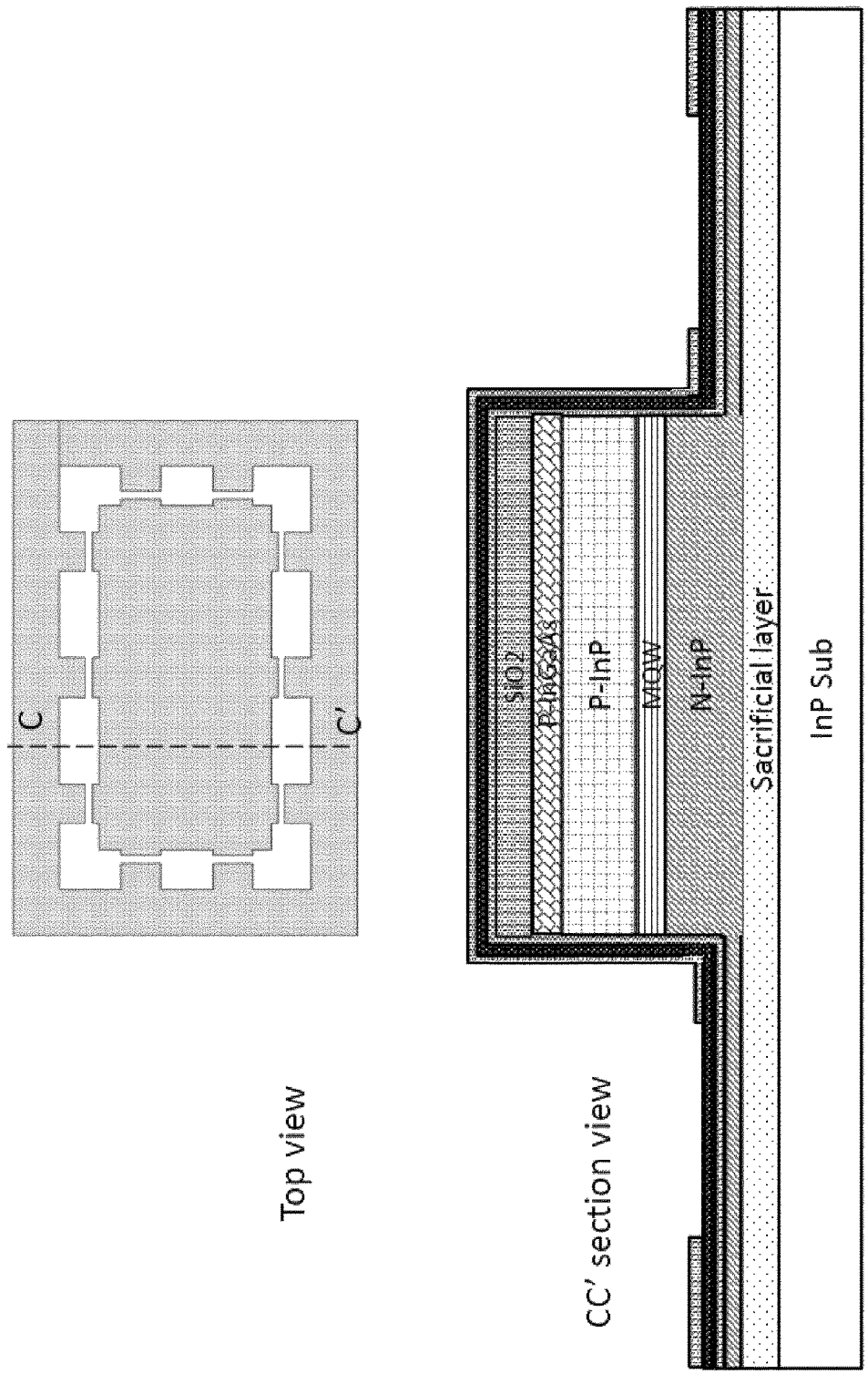
Figure 7A:
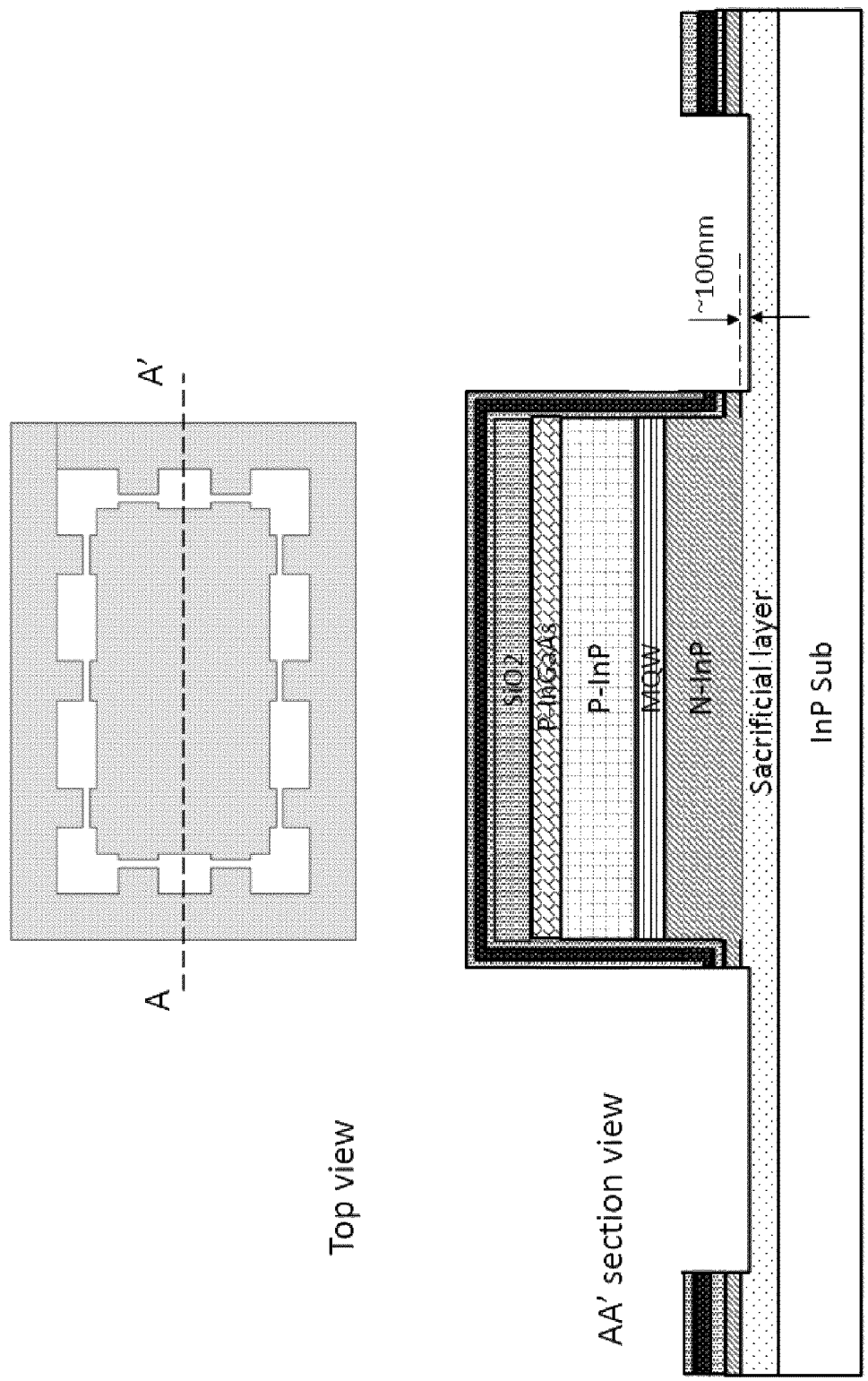
Figure 7B:
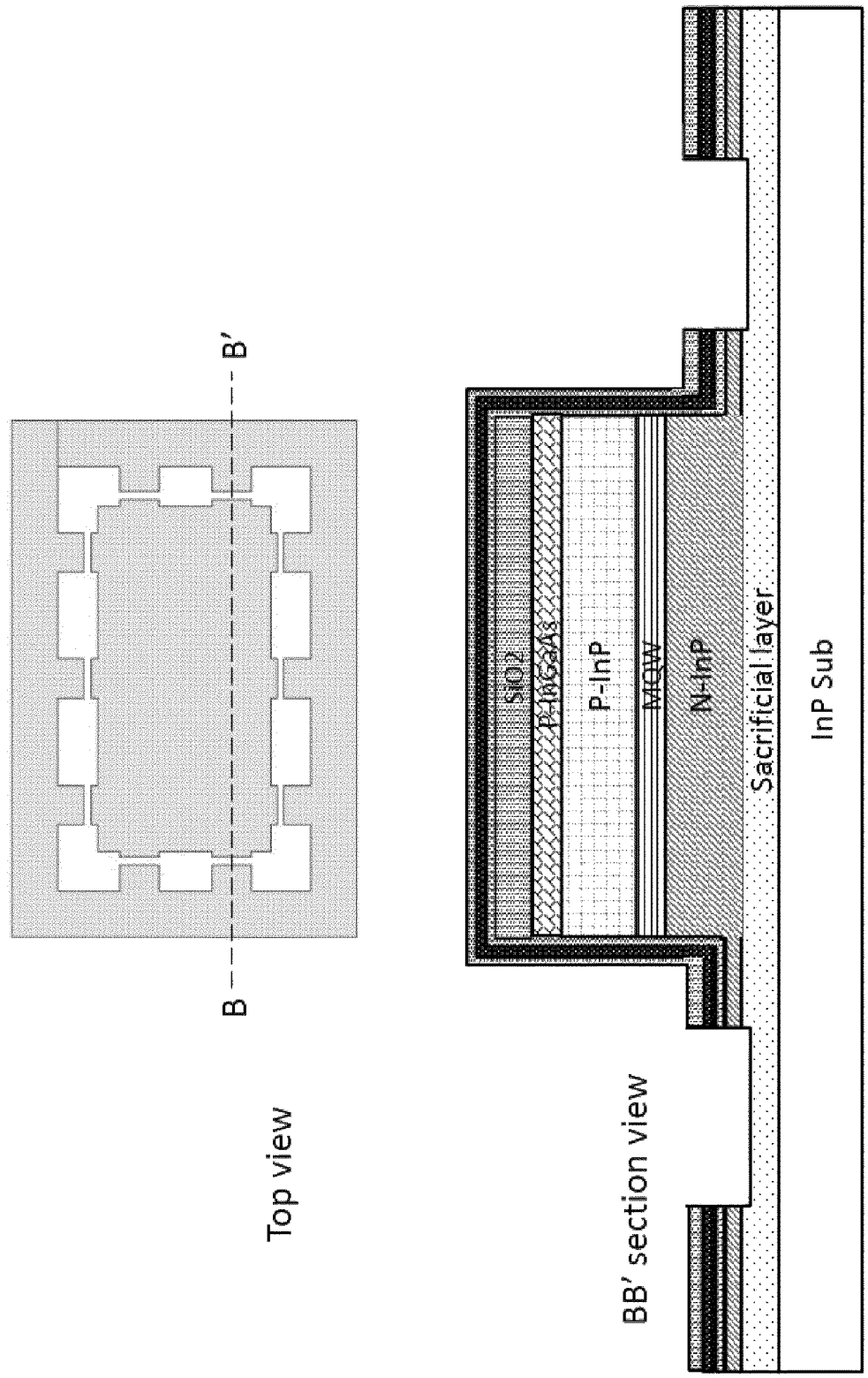
Figure 7C:
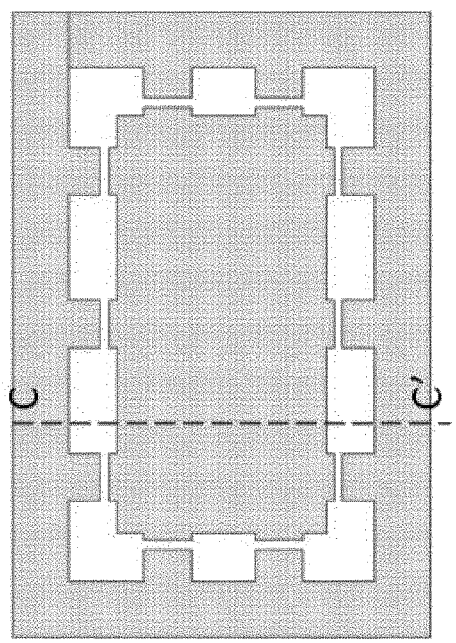
Figure 7C:
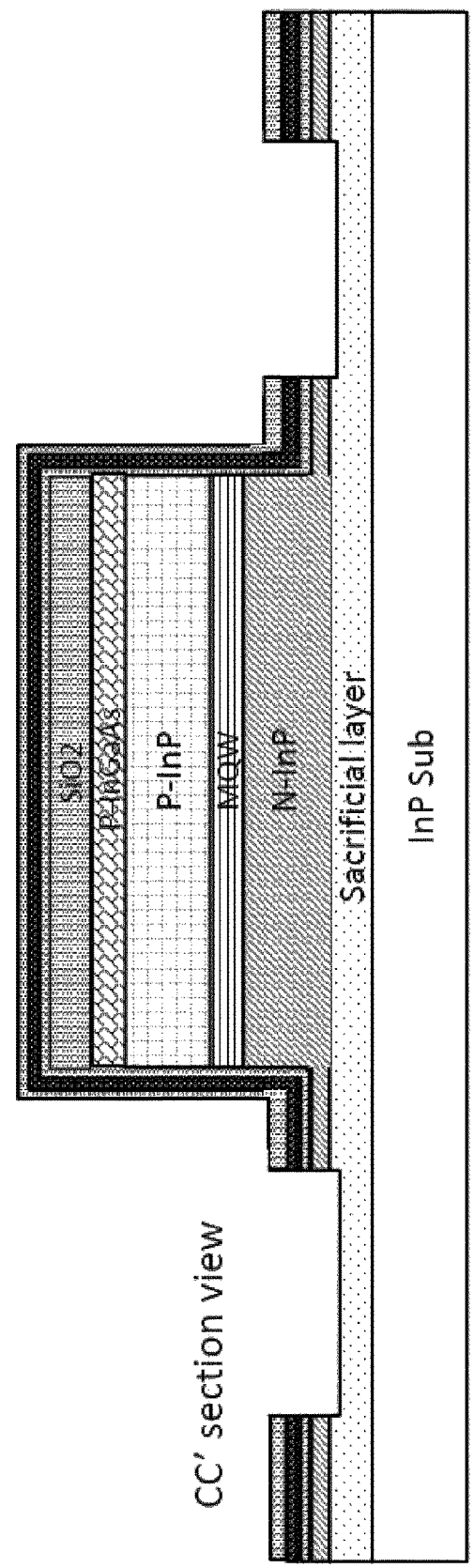

In a step shown in FIGS. 5A-5C, a wet etch is performed to remove exposed silicon dioxide. An optional additional 100 nm hard ask silicon nitride layer (not shown here) can be dry etched before this wet etch, and this optional hard mask can be removed in the steps shown in FIGS. 7A-7C without any additional steps. The etch is intentionally over performed, so that the facet sidewalls of the $SiO_2$ feet are removed as shown in the cross-sectional views most clearly. After this etch, the photoresist is removed as shown in FIGS. 6A-6C. An anisotropic dry etch is then performed, to remove exposed silicon nitride, silicon dioxide, and n-doped indium phosphide with high selectivity. The etch intentionally extends into the sacrificial layer by around 100 nm. The results of this are shown in FIGS. 7A-7C.

Figure 8A:
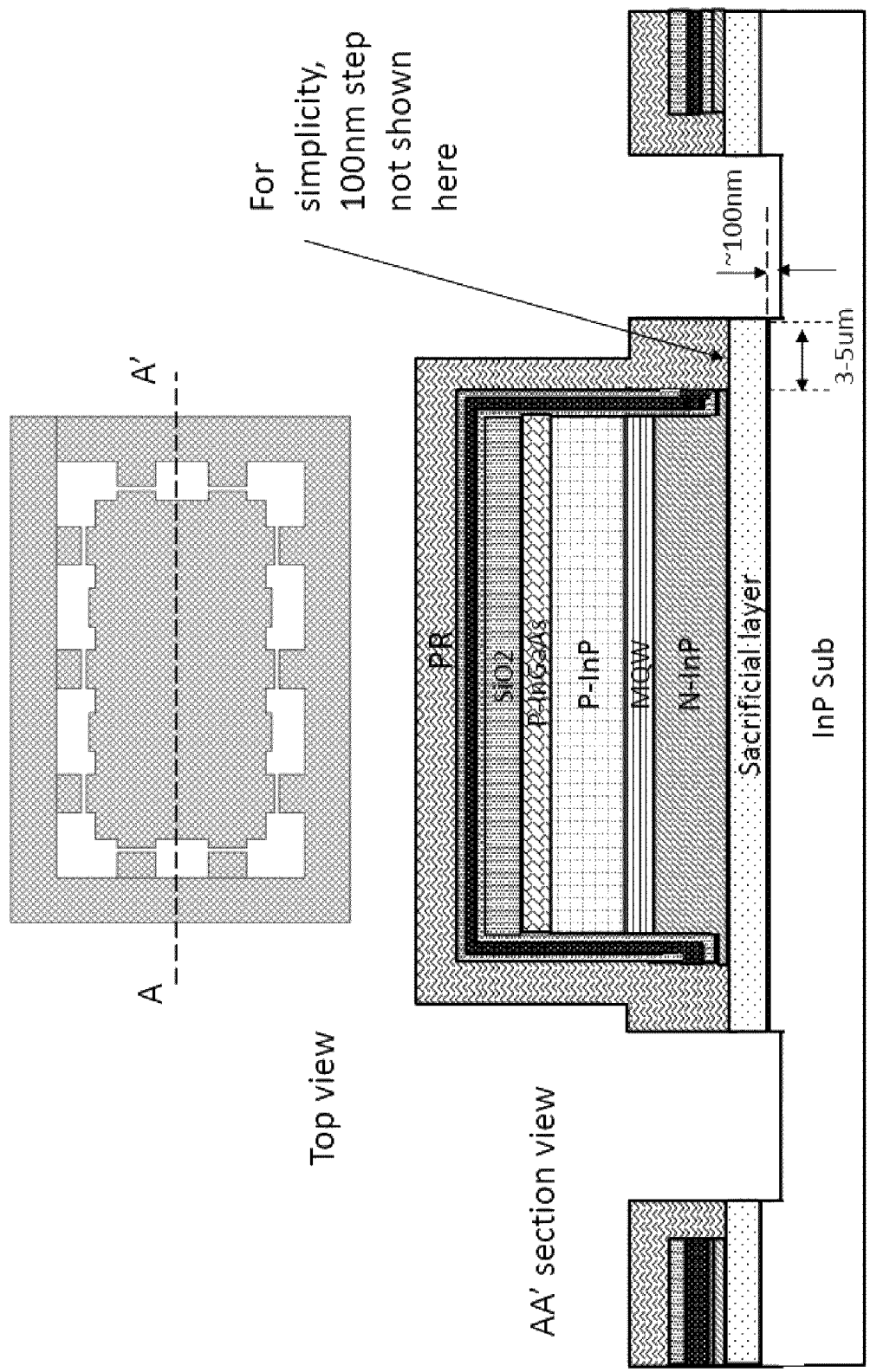
Figure 8B:
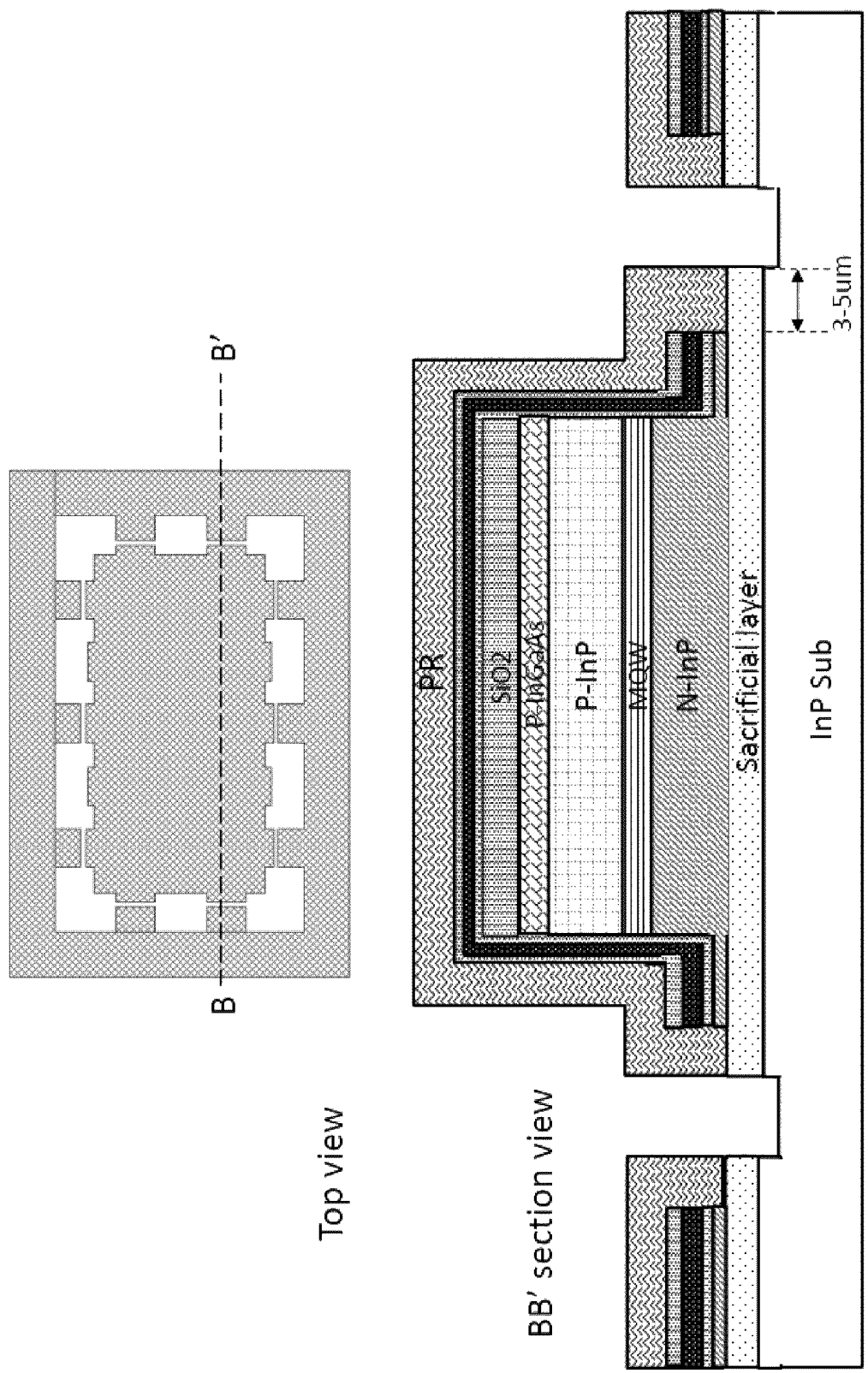
Figure 8C:
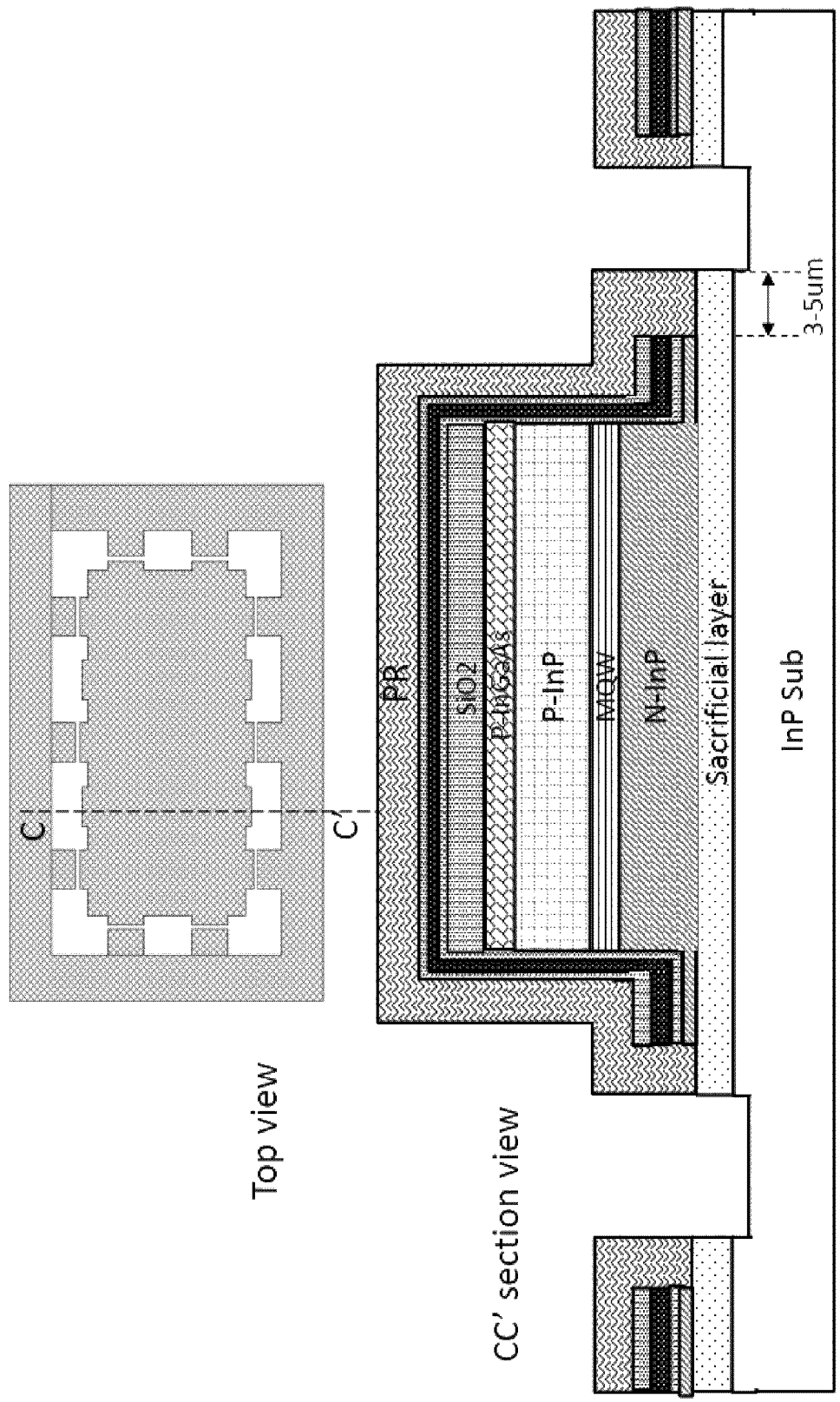

In a step shown in FIGS. 8A-8C, further photoresist is spun coated onto the source wafer and patterned for sacrificial layer etching. The sacrificial layer is then etched away, and around 100 nm of the underlying indium phosphide substrate is also etched away. The sacrificial layer is etched close to the facet with self-alignment with the ARC as a hard mask. It should be noted that, as shown in FIG. 8B, the sacrificial layer is etched in some places in the middle of the gap between the photoresist and so some sacrificial layer is left unetched (i.e. those portions protected by photoresist). Further, as shown in FIG. 8C, the sacrificial layer on the coupon sidewall is covered by photoresist and so is unetched in this step.

Figure 9A:
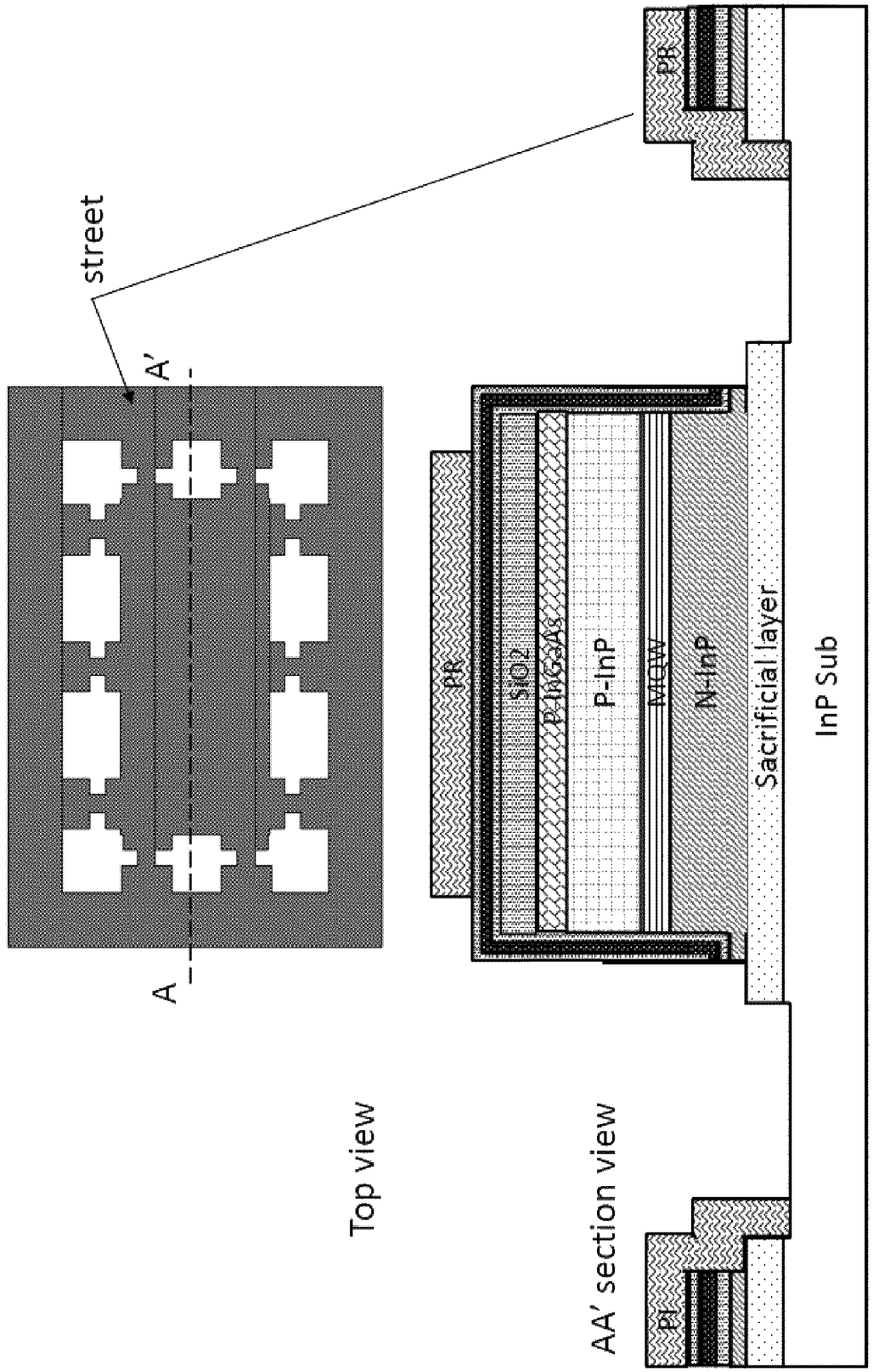
Figure 9B:
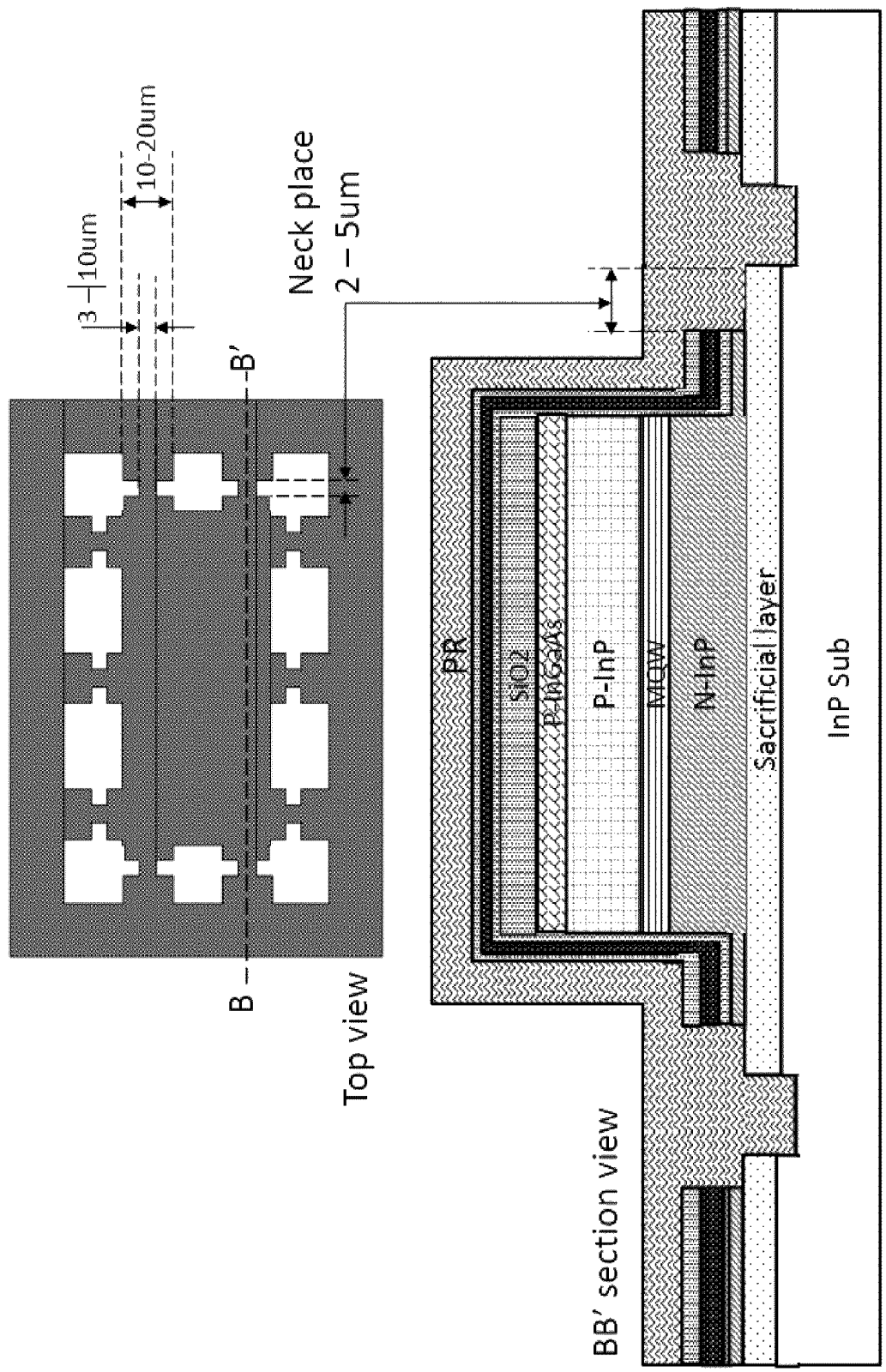
Figure 9C:
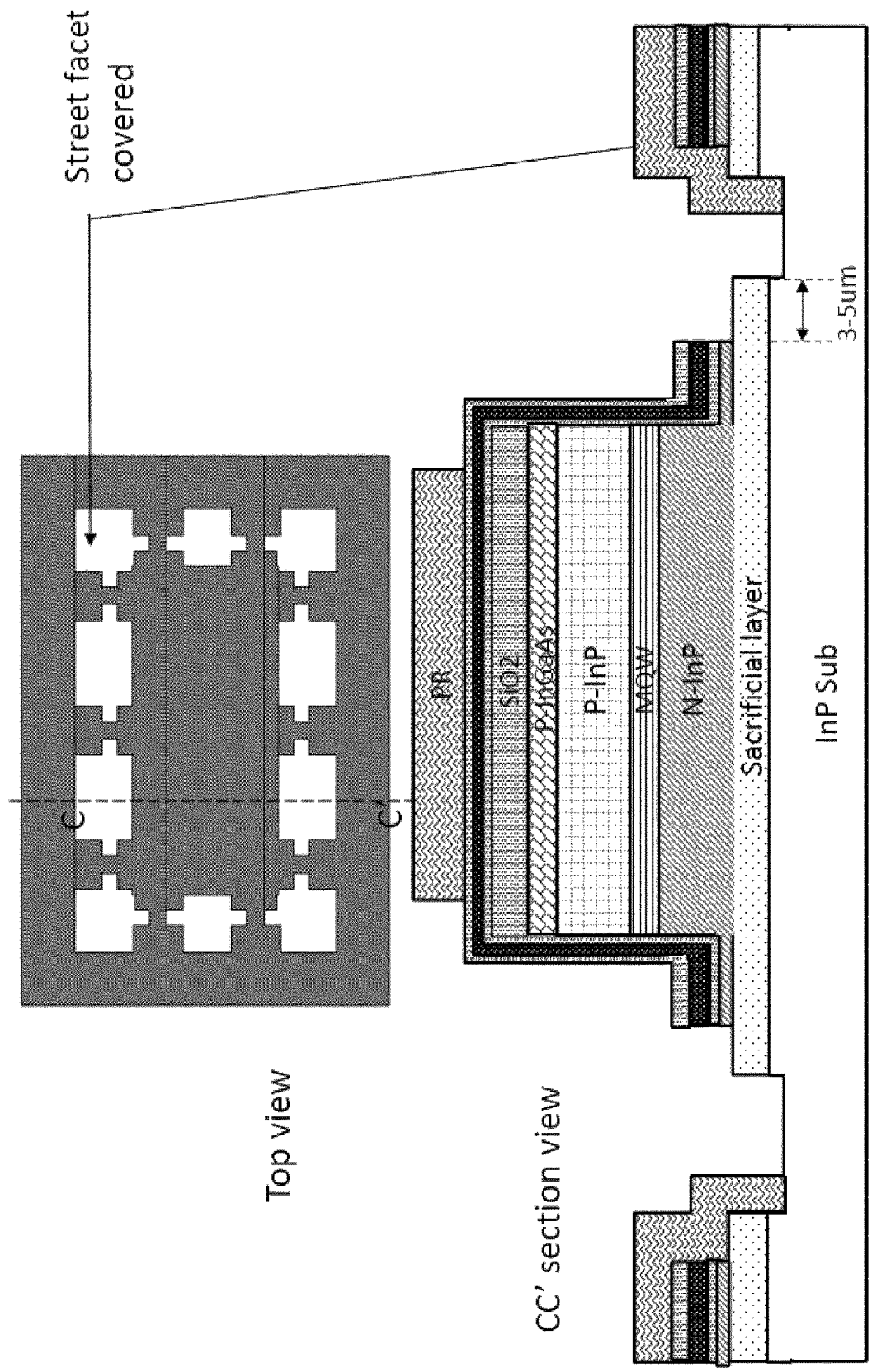

Next, in a step, shown in FIGS. 9A-9C, a photoresist adhesion promoter (for example hexamethyldisilazane, HMDS) is applied onto the source wafer. Subsequently, a 3-4 μm photoresist is further spun onto the source wafer and patterned. The street facet is protected by photoresist, as shown in the cross-sectional figures most clearly. This photoresist defines the breaking regions, or breaking points, of the source wafer. The breaking points, here necks of photoresist, span a distance of 2 μm to 5 μm wide. They may be 3 μm to 10 μm wide, and adjacent portions of the photoresist may be 10 μm to 20 μm wide. The breaking points are designed to be the weakest point, whilst being strong enough to overcome the capillary force in the sacrificial layer etching process and yet weak enough to be the preferential breaking point during the pick-up process.

Figure 10A:
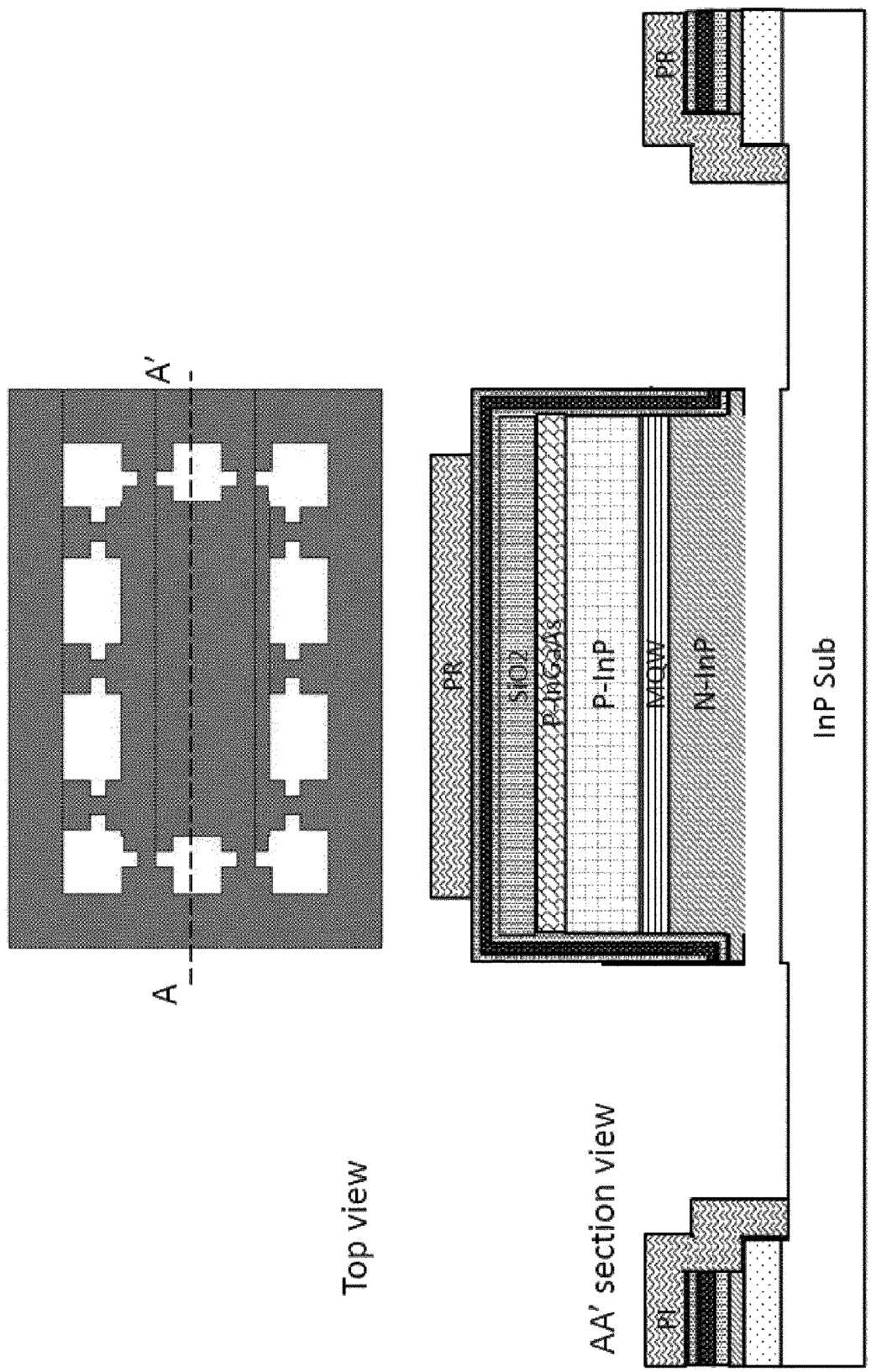
Figure 10B:
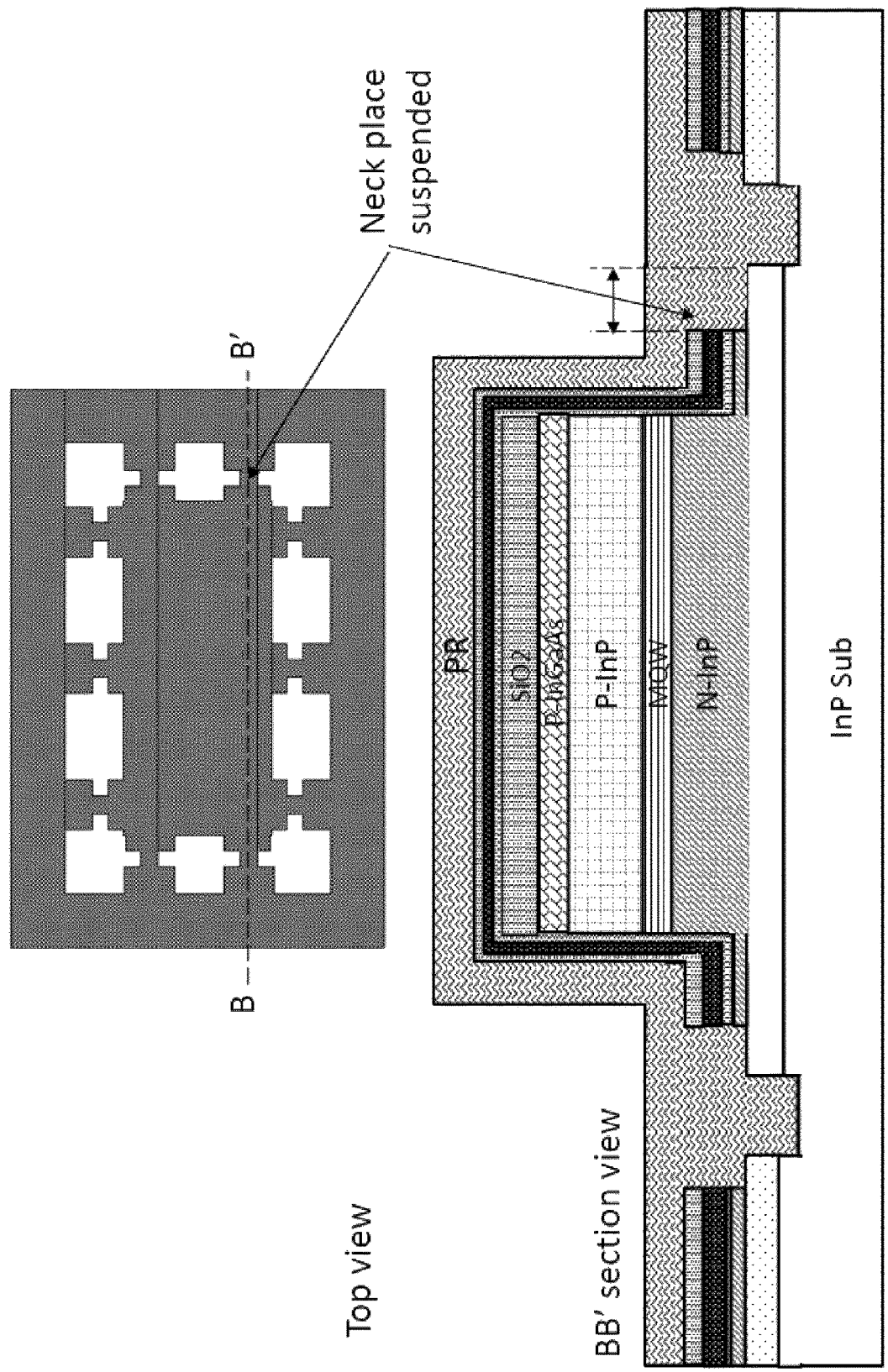
Figure 10C:
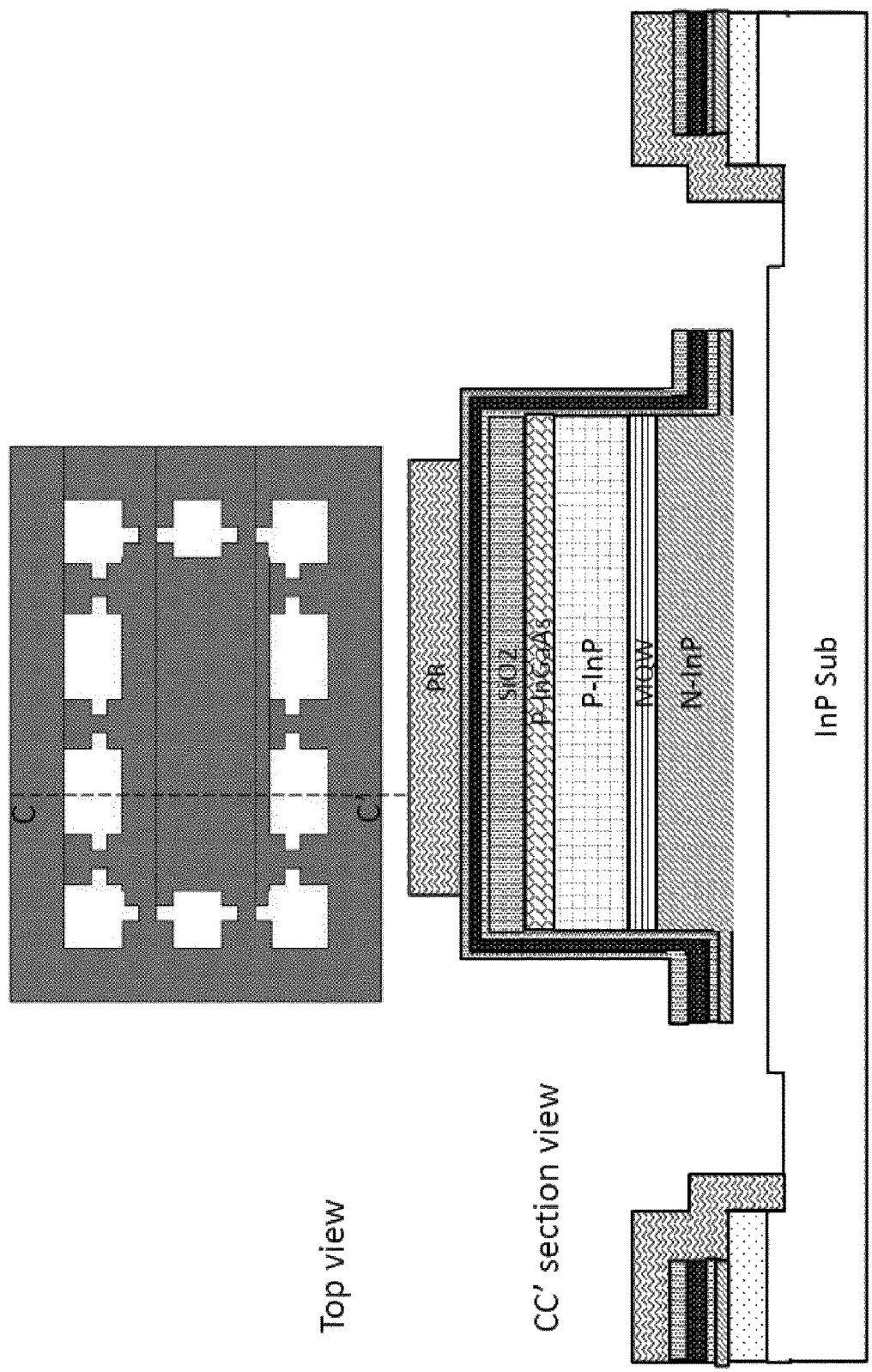

The sacrificial layer is then etched away via a wet etched. The result of this is shown in FIGS. 10A-10C. The device coupon is now suspended by the breaking regions, and an air gap exists between the device coupon and the substrate. An air gap also exists between the neck regions and the substrate, as shown in FIG. 10B. The tether keeps the coupon suspended with good enough adhesion and strength.

Figure 11:
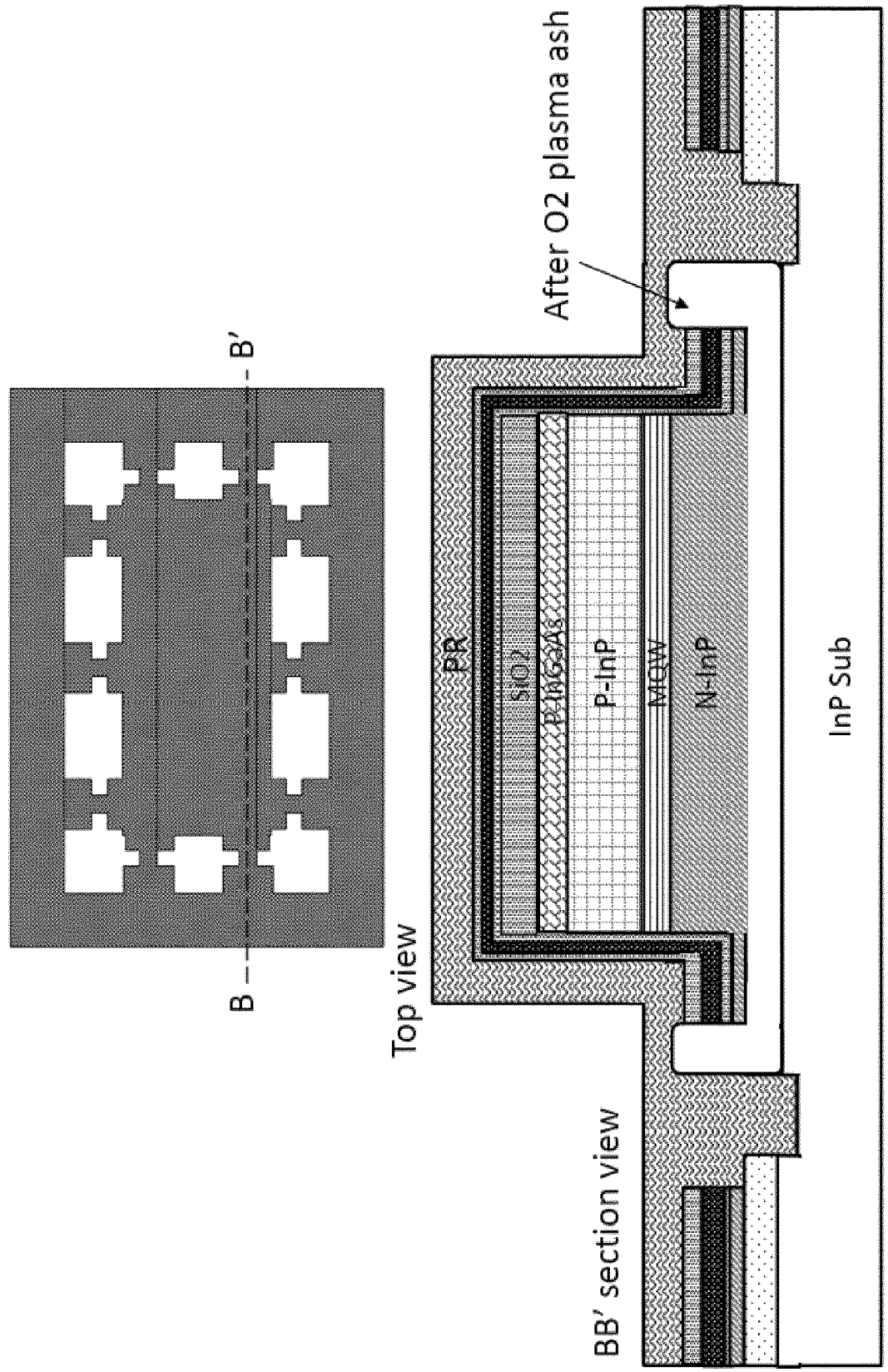
FIG. 11 shows an optional further step of the method.

FIG. 11 shows an optional further step of the method. If the tether neck is too strong to break appropriately during the pick-up process, an $O_2$ plasma ash can be performed to etch away some of the photoresist tether. This can be achieved because the neck is suspended and therefore exposed to the $O_2$ plasma in all three dimensions. This step further weakens the neck regions of the tether, and therefore makes it easier for them to break in the subsequent pick-up process.

Figure 12:
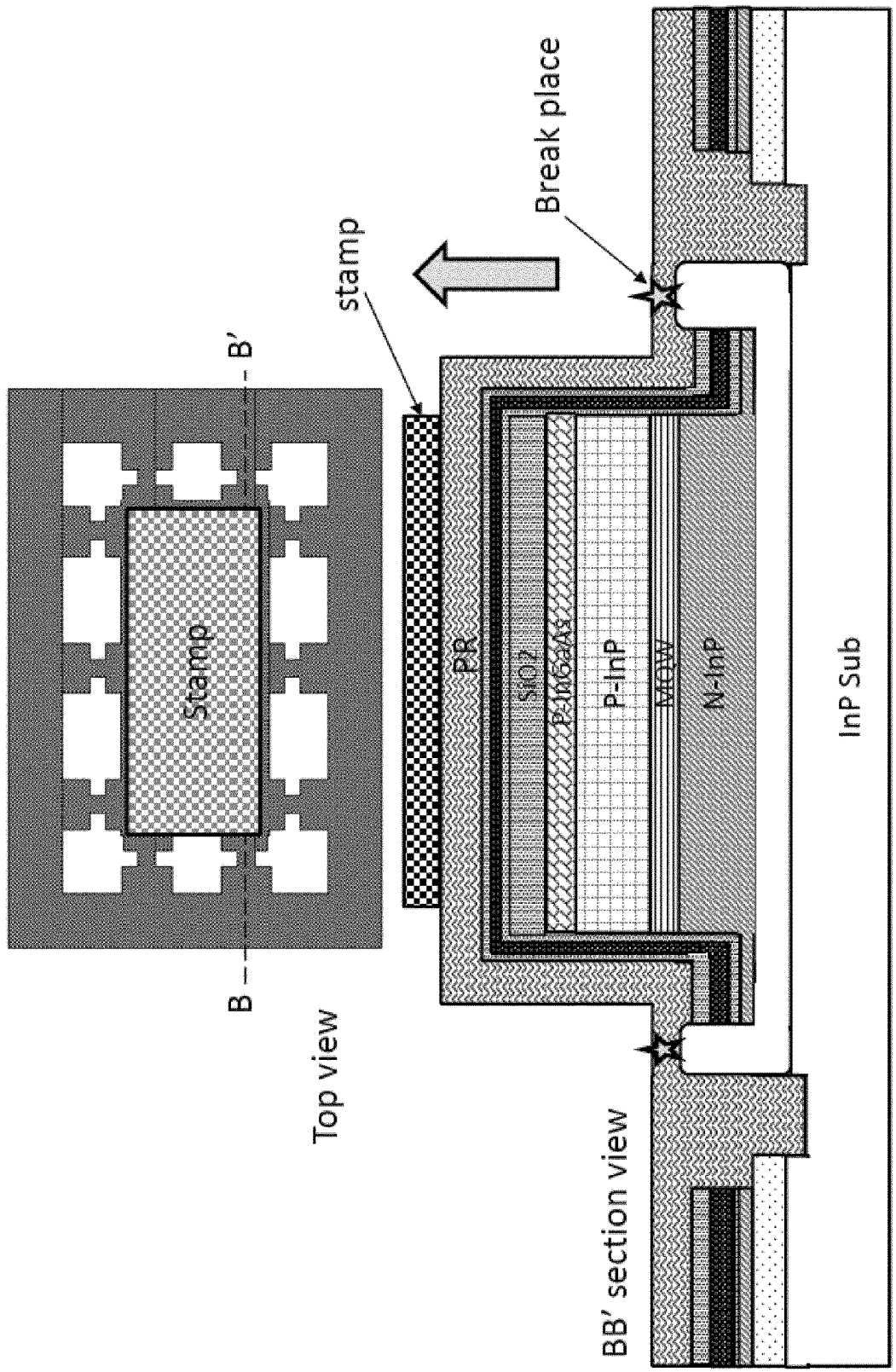
FIGS. 12 and 13 show top-down and cross-sectional views of a micro-transfer printing process according to an embodiment of the present invention.
Figure 13:
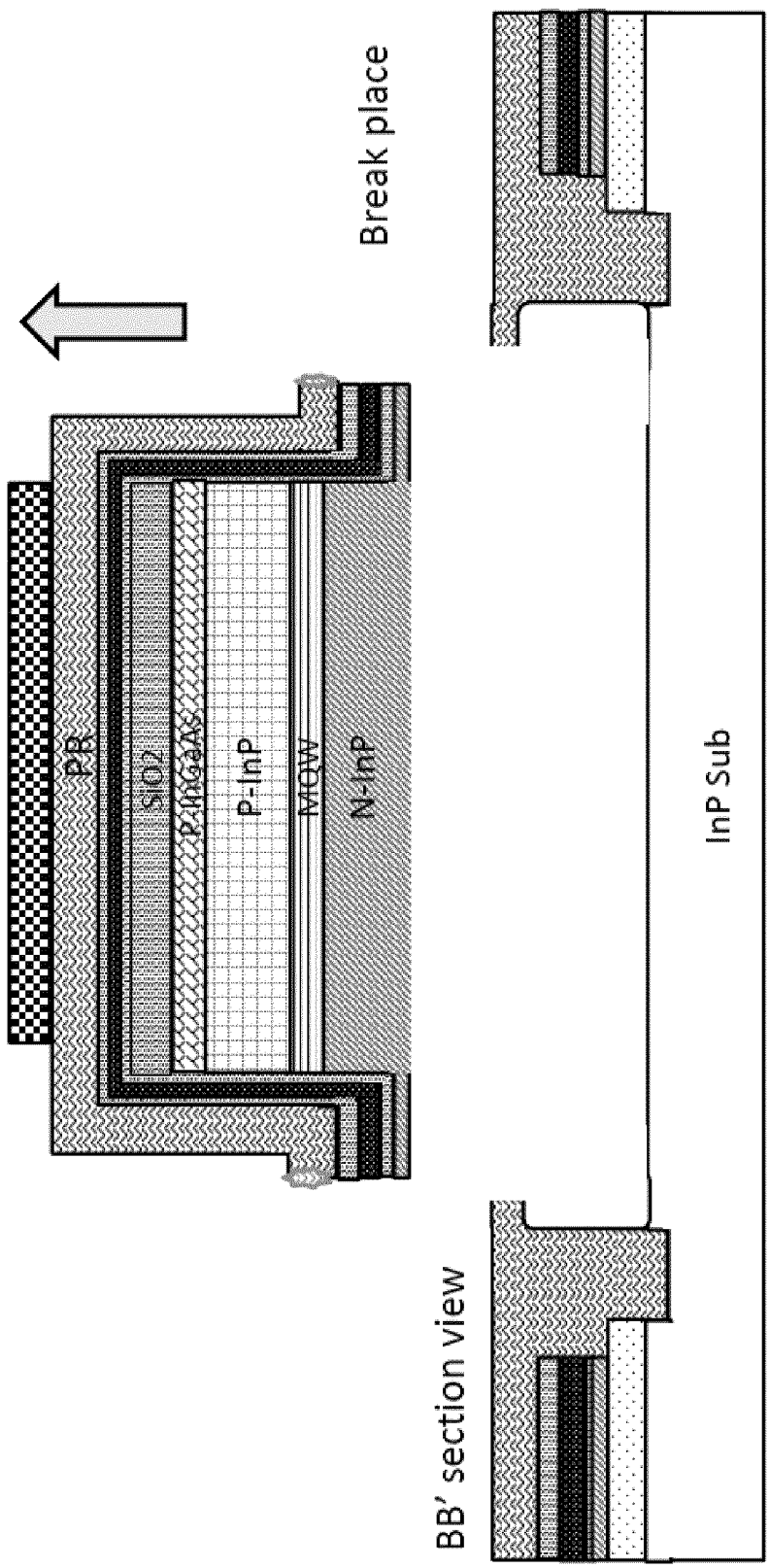

FIGS. 12 and 13 show top-down and cross-sectional views of a micro-transfer printing process according to an embodiment of the present invention. A stamp is attached to the uppermost surface of the device coupon, in this example the photoresist. The stamp is then lifted away from the substrate causing the tether to break at the breaking regions. Due to the reduction in the breaking area as compared to the prior art, no or substantially fewer tether debris are generated. Further, due to their location any debris are unlikely to adhere to the bottom of the coupon which further improves print yield.

Figure 14:
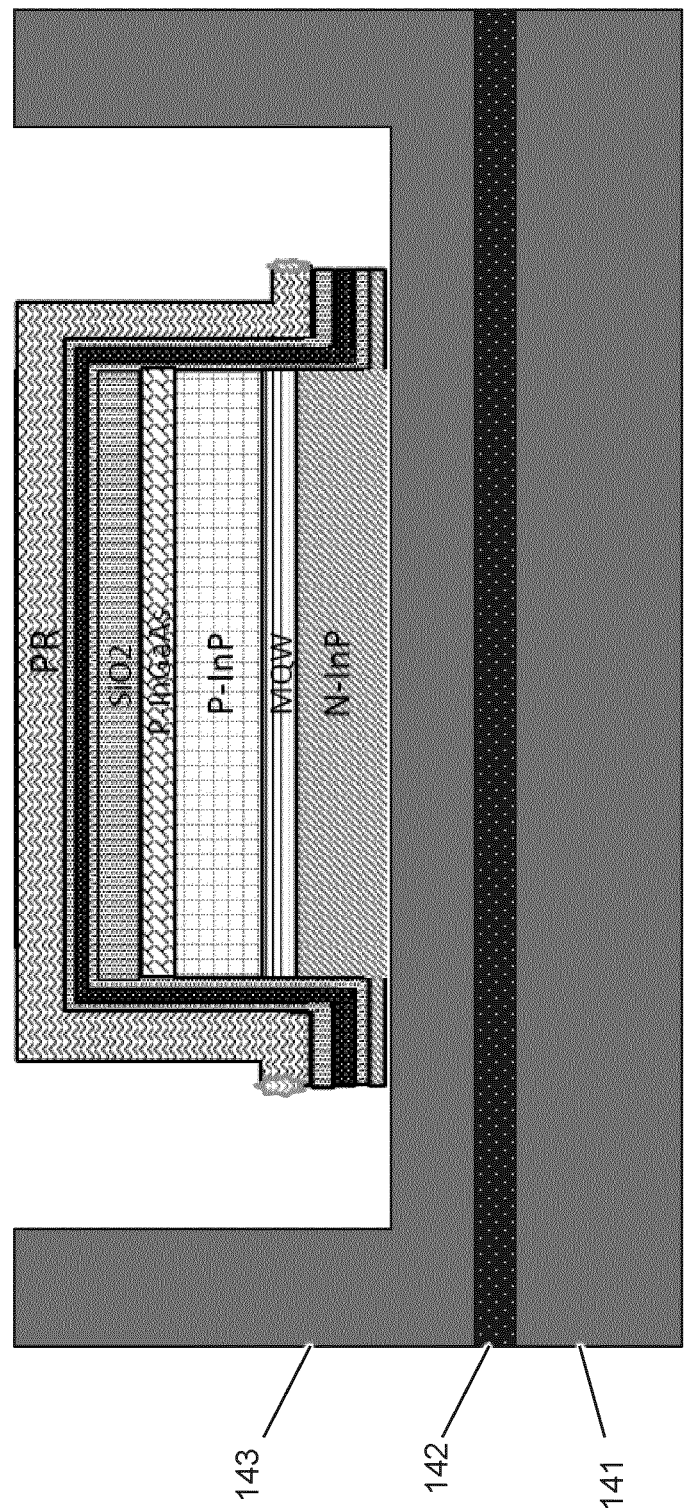
FIG. 14 shows an optoelectronic component according to an embodiments of the present invention.

FIG. 14 shows an optoelectronic component according to an embodiments of the present invention. The device coupon is placed within the cavity of a platform wafer, and adhered to a bed thereof. The platform wafer is formed of a silicon substrate 141, buried oxide layer 142, and a silicon-on-insulator layer 143.

The features disclosed in the description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

The invention claimed is:

1. A source wafer for use in a micro-transfer printing process, the source wafer comprising:
    a substrate;
    a device coupon, including an optoelectronic device;
    an air cavity extending around a periphery of the device coupon and extending from a bottom surface of the device coupon to the substrate; and
    a breakable tether securing the device coupon to the substrate and comprising a different material than the substrate, the breakable tether including one or more breaking regions which connect the breakable tether to the substrate,
    wherein a neck of a first breaking region of the one or more breaking regions extends away from the device coupon and across the air cavity along a first direction parallel to a plane of the substrate to a first adjacent portion of the breakable tether,
    wherein the air cavity is between the neck and the substrate, and
    wherein the neck is thinner, along a second direction perpendicular to the plane of the substrate, than the first adjacent portion, and the neck is narrower, along a third direction parallel to the plane of the substrate, than the first adjacent portion.

2. The source wafer of claim 1, wherein each of the one or more breaking regions includes a neck of breakable tether material which extends across the air cavity between the device coupon and a tether street which at least partially surrounds the device coupon.

3. The source wafer of claim 1, wherein each of the one or more breaking regions is thinner than adjacent portions of the breakable tether.

4. The source wafer of claim 1, wherein each of the one or more breaking regions is narrower than adjacent portions of the breakable tether.

5. The source wafer of claim 1, wherein the breakable tether includes a plurality of breaking regions which are disposed around the periphery of the device coupon.

6. The source wafer of claim 1, wherein the device coupon is secured to the substrate only by the one or more breaking regions of the breakable tether.

7. The source wafer of claim 2, further comprising a sacrificial layer between the tether street and the substrate.

8. The source wafer of claim 1, wherein the optoelectronic device is formed of one or more III-V semiconductor materials.

9. The source wafer of claim 1, wherein the optoelectronic device comprises a plurality of layers.

10. The source wafer of claim 1, wherein the device coupon includes one or more protective outer layers.

11. The source wafer of claim 10, wherein the protective outer layers include: an outer silicon dioxide layer, an intermediate silicon nitride layer, and an inner silicon dioxide layer.

12. The source wafer of claim 1, wherein the one or more breaking regions are weaker than adjacent regions of the breakable tether.

13. The source wafer of claim 1, wherein the optoelectronic device is an optoelectronic device selected from the group consisting of lasers, photodetectors, and electro-absorption modulators.

14. The source wafer of claim 1, wherein the device coupon is spaced apart from the substrate by the air cavity, which extends entirely around the device coupon, wherein the one or more breaking regions bridge the air cavity to secure the device coupon to the substrate.

15. A method of preparing the source wafer of claim 1 for a micro-transfer printing process, the method comprising:
    etching a precursor tether, disposed over at least a portion of the device coupon and substrate, to define the breakable tether.

16. The method of claim 15, further comprising etching the substrate and/or device coupon so that the device coupon is secured to the substrate by the breaking regions of the breakable tether.

17. The method of claim 16, wherein further etching the substrate and/or device coupon includes etching away a sacrificial layer located between the device coupon and the substrate.

18. The method of claim 15, wherein etching the precursor tether includes an initial step of patterning the precursor tether to define the one or more breaking regions.

19. The method of claim 15, further comprising a step of performing a plasma ashing process, to remove a portion of the breakable tether.

20. The method of claim 15, further comprising a step of at least partially encapsulating the device coupon in a protective layer.

21. A method of fabricating an optoelectronic component via a micro-transfer printing process using the source wafer of claim 1, comprising the steps of:
    adhering the device coupon to a stamp;
    lifting the device coupon away from the substrate, thereby breaking the breakable tether at the or each breaking region; and
    printing the device coupon onto a platform wafer.

22. The source wafer of claim 1, further comprising a tether street above the substrate and extending around the air cavity,
    wherein the breakable tether includes a plurality of breaking regions, each of the breaking regions extending across the air cavity to connect the breakable tether to the substrate,
    wherein the first breaking region extends across the air cavity along the first direction to the tether street,
    wherein the neck of the first breaking region is between the first adjacent portion and a second adjacent portion of the first breaking region along the first direction, and the neck and the first and second adjacent portions of the first breaking region are each positioned between two openings along the third direction,
    wherein the third direction is perpendicular to the first direction, and the neck is narrower, along the third direction than each of the first and second adjacent portions.

* * * * *